(12) United States Patent
Mihara

(10) Patent No.: US 10,629,704 B2
(45) Date of Patent: Apr. 21, 2020

(54) SEMICONDUCTOR DEVICE AND METHOD FOR MANUFACTURING THE SAME

(71) Applicant: Renesas Electronics Corporation, Tokyo (JP)

(72) Inventor: Tatsuyoshi Mihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/116,633

(22) Filed: Aug. 29, 2018

(65) Prior Publication Data

US 2019/0148518 A1 May 16, 2019

(30) Foreign Application Priority Data

Nov. 14, 2017 (JP) ................................. 2017-219407

(51) Int. Cl.
| | |
|---|---|
| H01L 27/115 | (2017.01) |
| H01L 21/28 | (2006.01) |
| H01L 29/49 | (2006.01) |
| H01L 29/51 | (2006.01) |
| H01L 29/66 | (2006.01) |
| H01L 27/11573 | (2017.01) |
| H01L 29/792 | (2006.01) |
| H01L 27/1157 | (2017.01) |

(Continued)

(52) U.S. Cl.
CPC ............ *H01L 29/66742* (2013.01); *H01L 21/823431* (2013.01); *H01L 27/1157* (2013.01); *H01L 27/11573* (2013.01); *H01L 29/40117* (2019.08); *H01L 29/42344* (2013.01); *H01L 29/66545* (2013.01); *H01L 29/66795* (2013.01); *H01L 29/66833* (2013.01); *H01L 29/792* (2013.01); *H01L 29/517* (2013.01)

(58) Field of Classification Search
CPC . H01L 29/4975; H01L 29/518; H01L 29/517; H01L 27/11573; H01L 29/66545
See application file for complete search history.

(56) References Cited

U.S. PATENT DOCUMENTS

| | | | |
|---|---|---|---|
| 5,828,120 A | 10/1998 | Ishikawa | |
| 2014/0227843 A1* | 8/2014 | Tsukamoto | ....... H01L 29/40117 438/275 |

(Continued)

FOREIGN PATENT DOCUMENTS

| | | |
|---|---|---|
| JP | H 09-289298 A | 11/1997 |
| JP | 2016-051745 A | 4/2016 |

*Primary Examiner* — Brian Turner
(74) *Attorney, Agent, or Firm* — McDermott Will & Emery LLP

(57) ABSTRACT

A semiconductor device in which the retention characteristics of a rewritable memory cell packaged together with a field effect transistor including a metal gate electrode are improved and a method for manufacturing the semiconductor device. The semiconductor device includes a field effect transistor with a metal gate electrode and a rewritable memory cell. The manufacturing method includes the step of replacing a dummy gate electrode with the metal gate electrode. Before the step of replacing the dummy gate electrode with the metal gate electrode, the method includes the steps of making the height of the memory cell lower than the height of the dummy gate electrode and forming a protective film for covering the memory cell.

9 Claims, 30 Drawing Sheets

(51) Int. Cl.
*H01L 21/8234* (2006.01)
*H01L 29/423* (2006.01)

(56) References Cited

U.S. PATENT DOCUMENTS

2016/0064389 A1* 3/2016 Mihara ............... H01L 27/1157
257/314
2016/0064507 A1* 3/2016 Amo ................... H01L 29/4975
257/314

* cited by examiner

FIG. 1
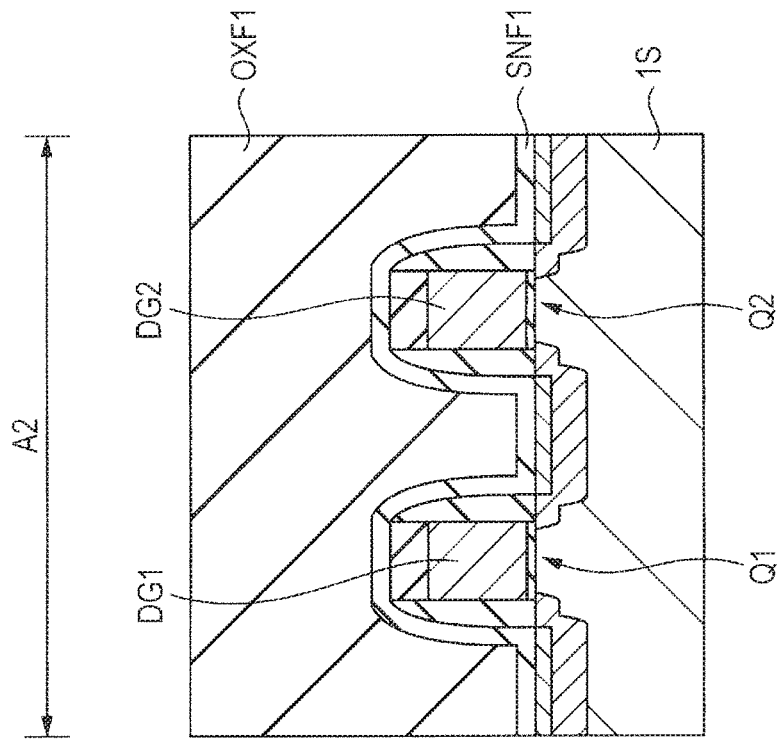
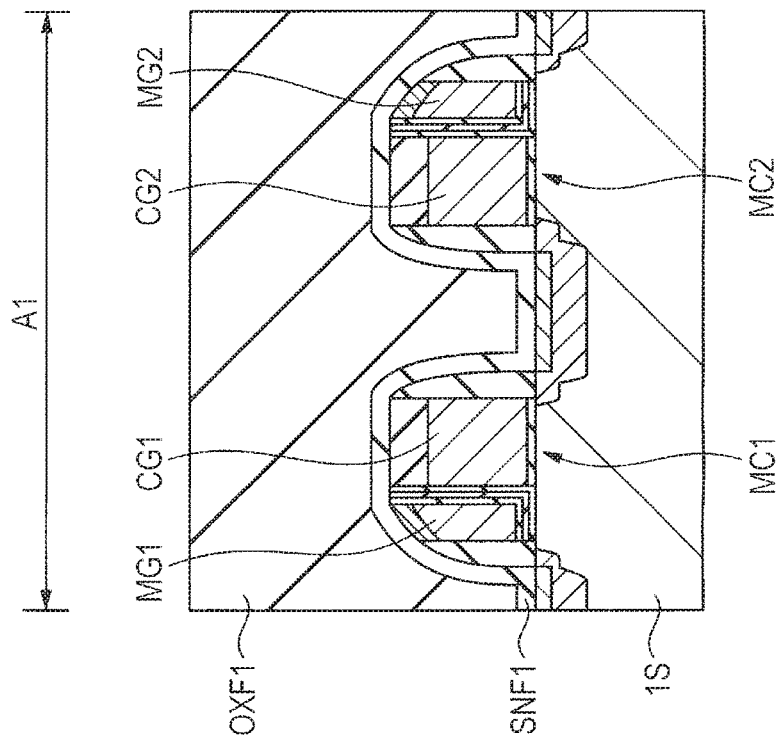

FIG. 4
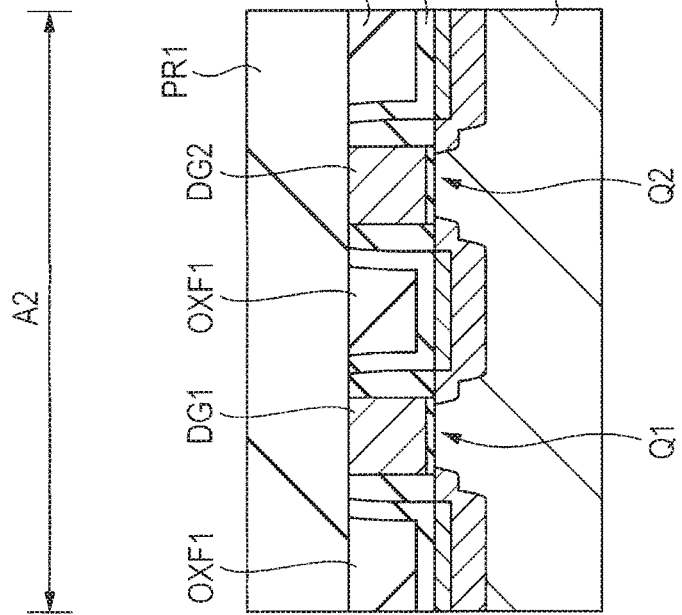
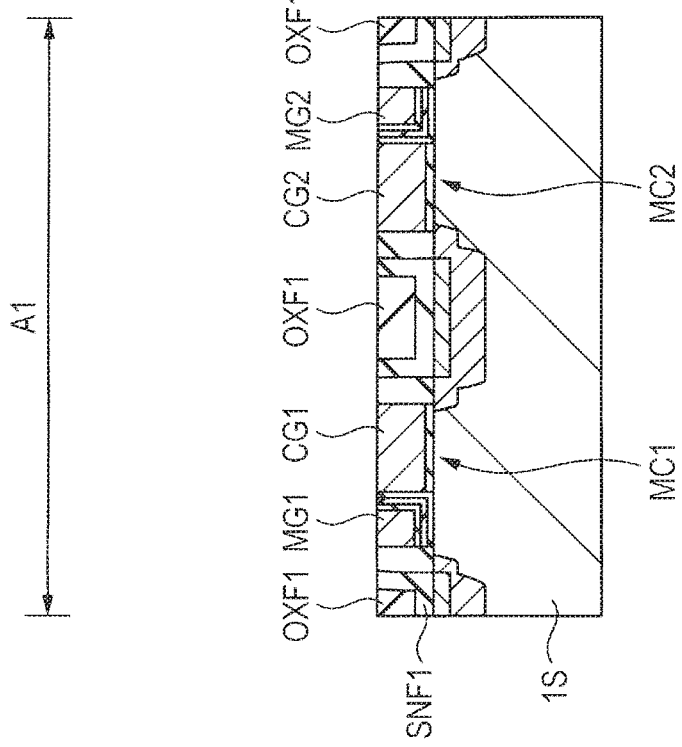

SEMICONDUCTOR DEVICE AND METHOD FOR MANUFACTURING THE SAME

CROSS-REFERENCE TO RELATED APPLICATIONS

The disclosure of Japanese Patent Application No. 2017-219407 filed on Nov. 14, 2017 including the specification, drawings and abstract is incorporated herein by reference in its entirety.

BACKGROUND

The present invention relates to a semiconductor device and a technique for manufacturing the same and more particularly to a semiconductor device which includes a field effect transistor with a metal gate electrode and a memory cell and a technique useful for manufacturing the same.

Japanese Unexamined Patent Application Publication No. 2016-51745 describes a technique for a semiconductor device which includes a low-height memory cell and a high-height field effect transistor.

Japanese Unexamined Patent Application Publication No. Hei 9(1997)-289298 describes a technique for forming a field effect transistor in each of the upper and lower level areas of a stepped semiconductor substrate.

SUMMARY

The process of manufacturing a semiconductor device which includes a field effect transistor with a metal gate electrode and a rewritable memory cell may include the step of replacing a dummy gate electrode with a metal gate electrode. The present inventors have newly found that the deterioration in the retention characteristics of the rewritable memory cell arises in the semiconductor device manufacturing method which includes the abovementioned replacing step. Therefore, in the semiconductor device manufacturing method which includes the step of replacing a dummy gate electrode of polysilicon film with a metal gate electrode, the need exists to improve the retention characteristics of the rewritable memory cell packaged together with the field effect transistor including a metal gate electrode.

The above and further objects and novel features of the invention will more fully appear from the following detailed description in this specification and the accompanying drawings.

According to one aspect of the present invention, there is provided a semiconductor device manufacturing method for a semiconductor device which includes a field effect transistor with a metal gate electrode and a rewritable memory cell and the method includes the step of replacing a dummy gate electrode with a metal gate electrode. The semiconductor device manufacturing method also includes the steps of making the height of the memory cell lower than the height of the dummy gate electrode and forming a protective film for covering the memory cell, before the step of replacing the dummy gate electrode with the metal gate electrode.

According to the present invention, the retention characteristics of a rewritable memory cell packaged together with a field effect transistor including a metal gate electrode are improved.

BRIEF DESCRIPTION OF THE DRAWINGS

FIG. 1 is a sectional view which shows a step in the process of manufacturing a semiconductor device according to a first embodiment of the invention, FIG. 4 is a sectional view which shows a step following the step shown in FIG. 3 in the process of manufacturing the semiconductor device.

DETAILED DESCRIPTION

Figure 2:
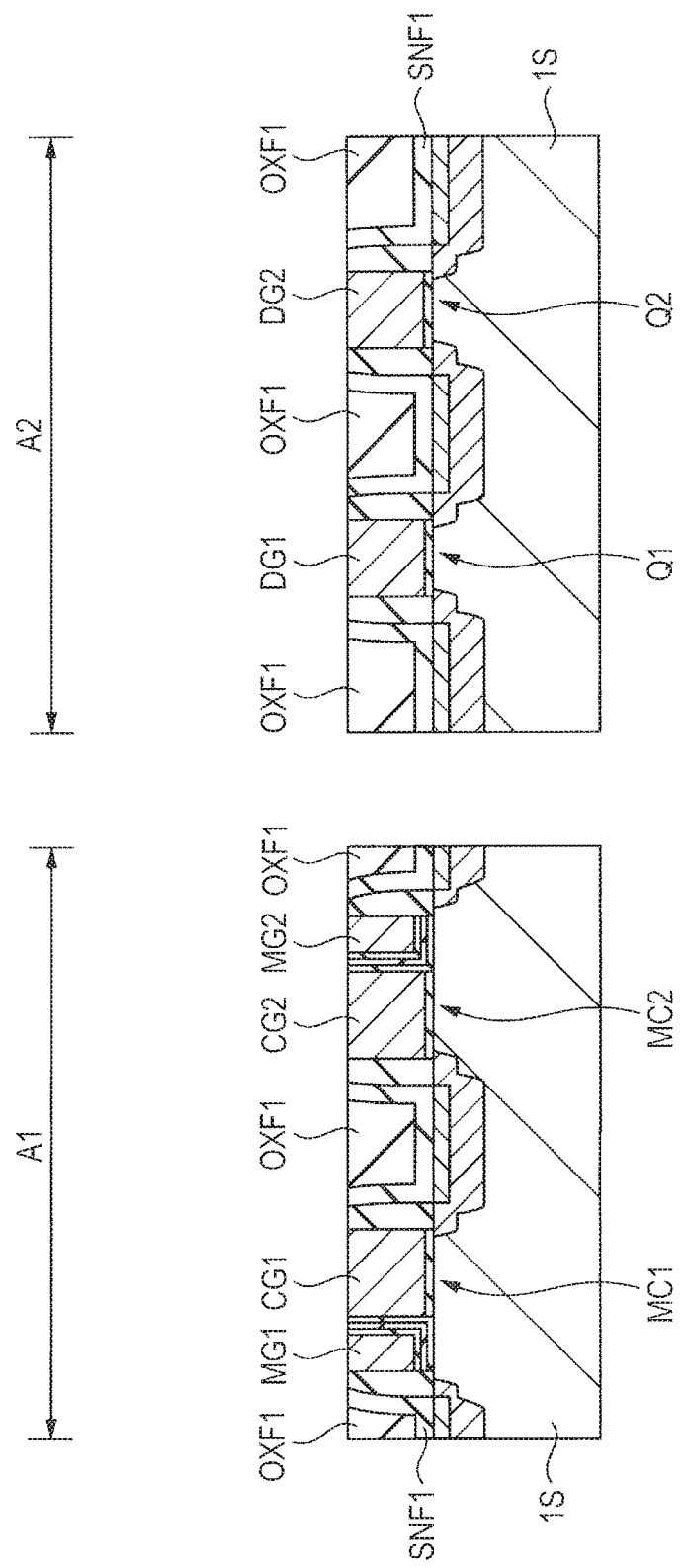
FIG. 2 is a sectional view which shows a step following the step shown in FIG. 1 in the process of manufacturing the semiconductor device.

The preferred embodiments of the present invention will be described below in different sections or separately as necessary or for the sake of convenience, but the embodiments described as such are not irrelevant to each other unless otherwise stated. One embodiment may be, in whole or in part, a modified, detailed or supplementary form of another.

Furthermore, in the preferred embodiments described below, when numerical information for an element (the number of pieces, numerical value, quantity, range, etc.) is given by a specific number, it is not limited to the specific number unless otherwise stated or theoretically limited to the specific number. It may be larger or smaller than the specific number.

Furthermore, in the preferred embodiments described below, constituent elements (including constituent steps) are not necessarily essential unless otherwise stated or considered theoretically essential.

Similarly, in the preferred embodiments described below, when a specific form or positional relation is indicated for an element, etc., it should be interpreted to include a form or positional relation which is substantially approximate or similar to the specific form or positional relation unless otherwise stated or theoretically limited to the specific form or positional relation. The same is true for the above numerical information and range.

In all the drawings that illustrate the preferred embodiments, basically the same members are designated by the same reference signs and description thereof is not repeated. For easy understanding, hatching may be used even in a plan view.

First Embodiment

<Research for Improvement>

The process of manufacturing a semiconductor device which includes a field effect transistor with a metal gate electrode and a rewritable memory cell may include the step of replacing a dummy gate electrode with a metal gate electrode. The present inventors have newly found that the semiconductor device manufacturing method which includes the step of replacing a dummy gate electrode with a metal gate electrode is more likely to cause the deterioration in the retention characteristics of the rewritable memory cell than a semiconductor device manufacturing method which does not include that step.

As a result of devoted research efforts, the present inventors have found out that at the step of replacing a dummy gate electrode with a metal gate electrode, the deterioration in the retention characteristics of the metal cell arises due to direct contact of the metal cell with a laminated film including a high-permittivity film and a metal-containing conductor film.

For the above reason, the first embodiment is designed to suppress the possibility of direct contact of the metal cell with the laminated film including a high-permittivity film and a metal-containing conductor film at the step of replacing the dummy gate electrode with the metal gate electrode. Next, the technical idea of the first embodiment thus designed will be explained referring to drawings.

<Method for Manufacturing Semiconductor Device>

First, as shown in FIG. 1, a semiconductor substrate 1S has a memory cell formation area A1 and a field effect transistor formation area A2. For example, using the ordinary semiconductor device manufacturing technique, a memory cell MC1 including a control gate electrode CG1 and a memory gate electrode MG1 and a memory cell MC2 including a control gate electrode CG2 and a memory gate electrode MG2 are formed on the semiconductor substrate 1S in the memory cell formation area A1. The memory cell MC1 (MC2) is a rewritable nonvolatile memory cell which has a charge storage film to store information. The charge storage film is an insulating film with a trap level. Specifically, the charge storage film of the memory cell MC1 (MC2) is a silicon nitride film.

Also, for example, using the ordinary semiconductor device manufacturing technique, a field effect transistor Q1 with a dummy gate electrode DG1 and a field effect transistor Q2 with a dummy gate electrode DG2 are formed in the field effect transistor formation area A2.

Then, as shown in FIG. 1, a silicon nitride film SNF1 is formed so as to cover the memory cell MC1 and memory cell MC2 and the field effect transistor Q1 and field effect transistor Q2 and then a silicon oxide film OXF1 is formed over the silicon nitride film SNF1.

Next, as shown in FIG. 2, the silicon oxide film OXF1 and the silicon nitride film SNF1 are polished, for example, by the chemical mechanical polishing (CMP) method. Consequently, the upper surface of the control gate electrode CG1 (CG2) and the upper surface of the memory gate electrode MG1 (MG2) of the memory cell MC1 (MC2) and the upper surface of the dummy gate electrode DG1 (DG2) of the field effect transistor Q1 (Q2) are exposed.

Figure 3:
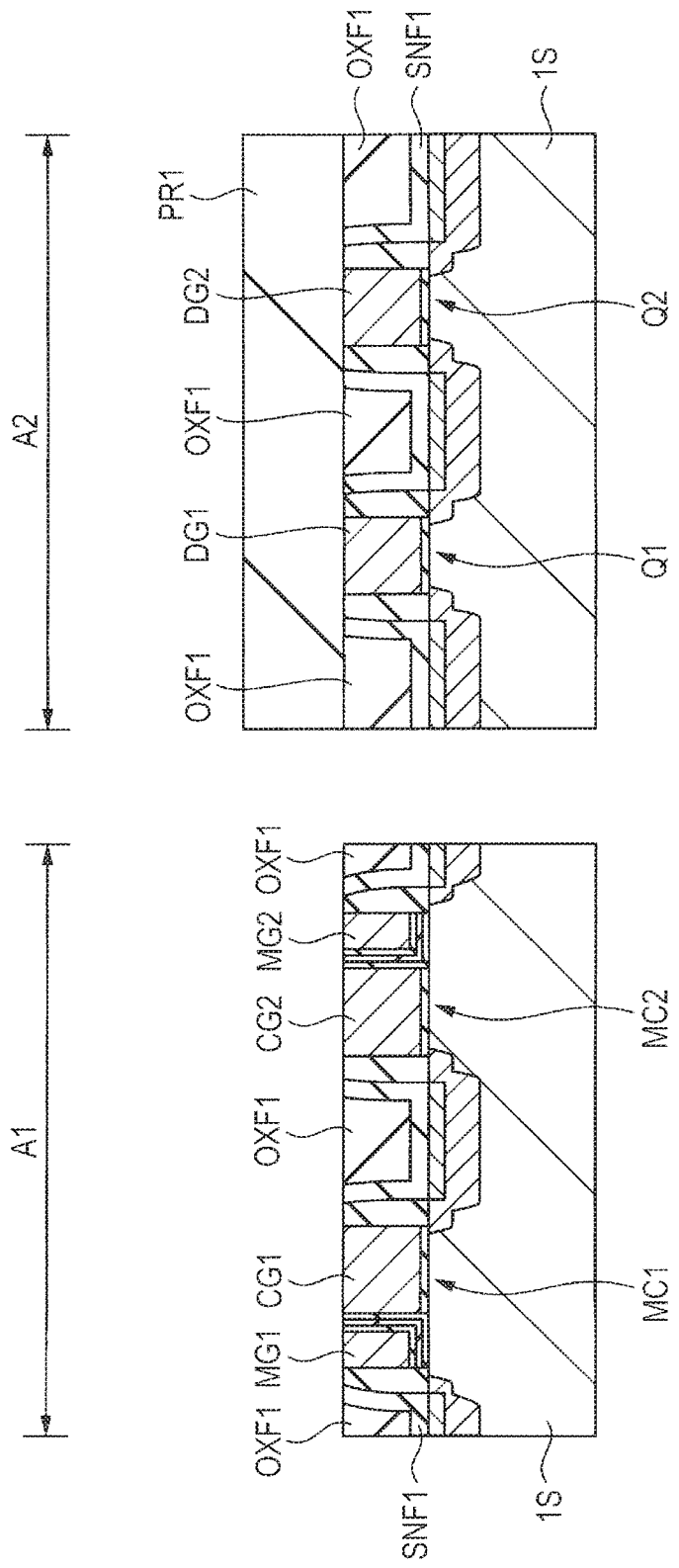
FIG. 3 is a sectional view which shows a step following the step shown in FIG. 2 in the process of manufacturing the semiconductor device.

Next, as shown in FIG. 3, using the photolithographic technique, the memory cell formation area A1 is exposed and a resist film PR1 for covering the field effect transistor formation area A2 is formed. Then, as shown in FIG. 4, by nonselective etching using the resist film PR1 as a mask, the height position of the control gate electrode CG1 (CG2) and the height position of the memory gate electrode MG1 (MG2) are made lower than the height position of the dummy gate electrode DG1 (DG2). At this time, nonselective etching can be dry etching. The amount of nonselective etching is approximately 20 nm to 40 nm.

Figure 5:
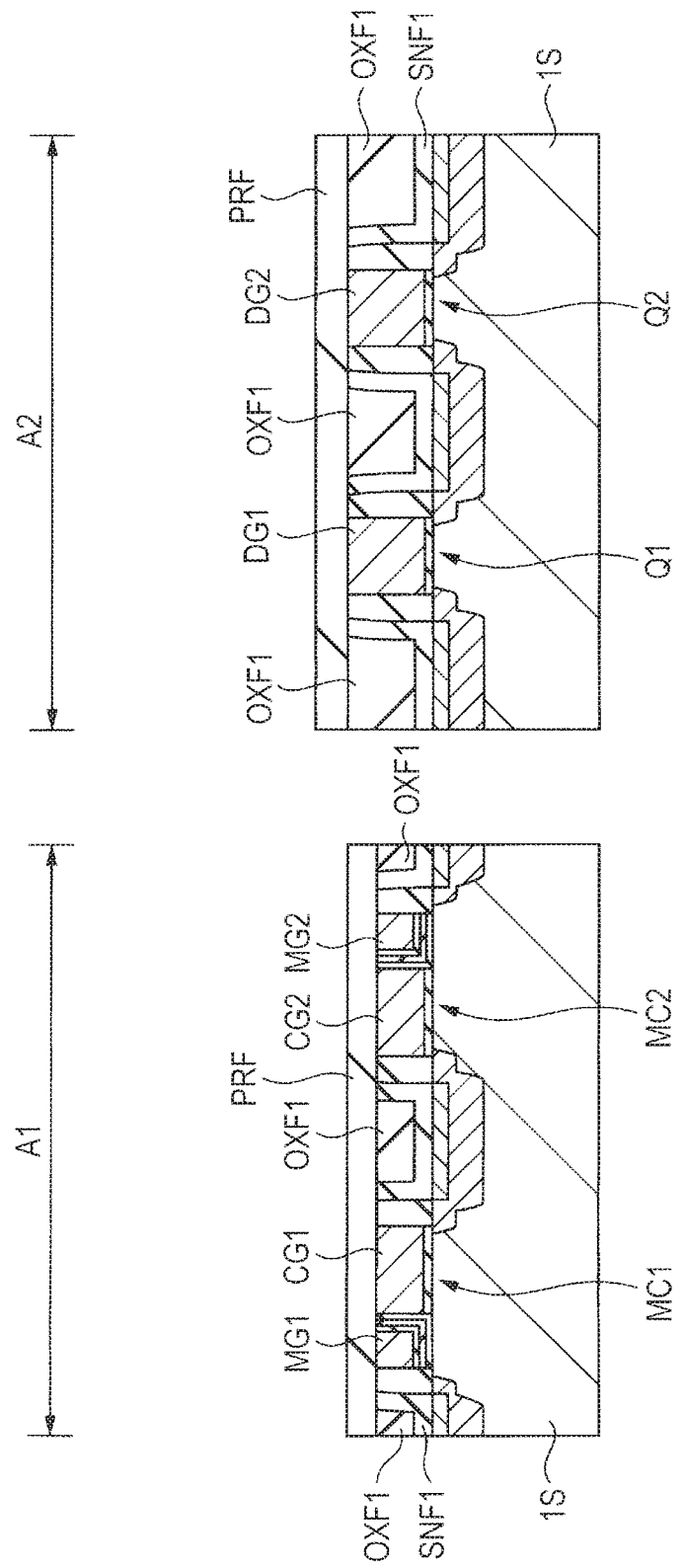
FIG. 5 is a sectional view which shows a step following the step shown in FIG. 4 in the process of manufacturing the semiconductor device.
Figure 6:
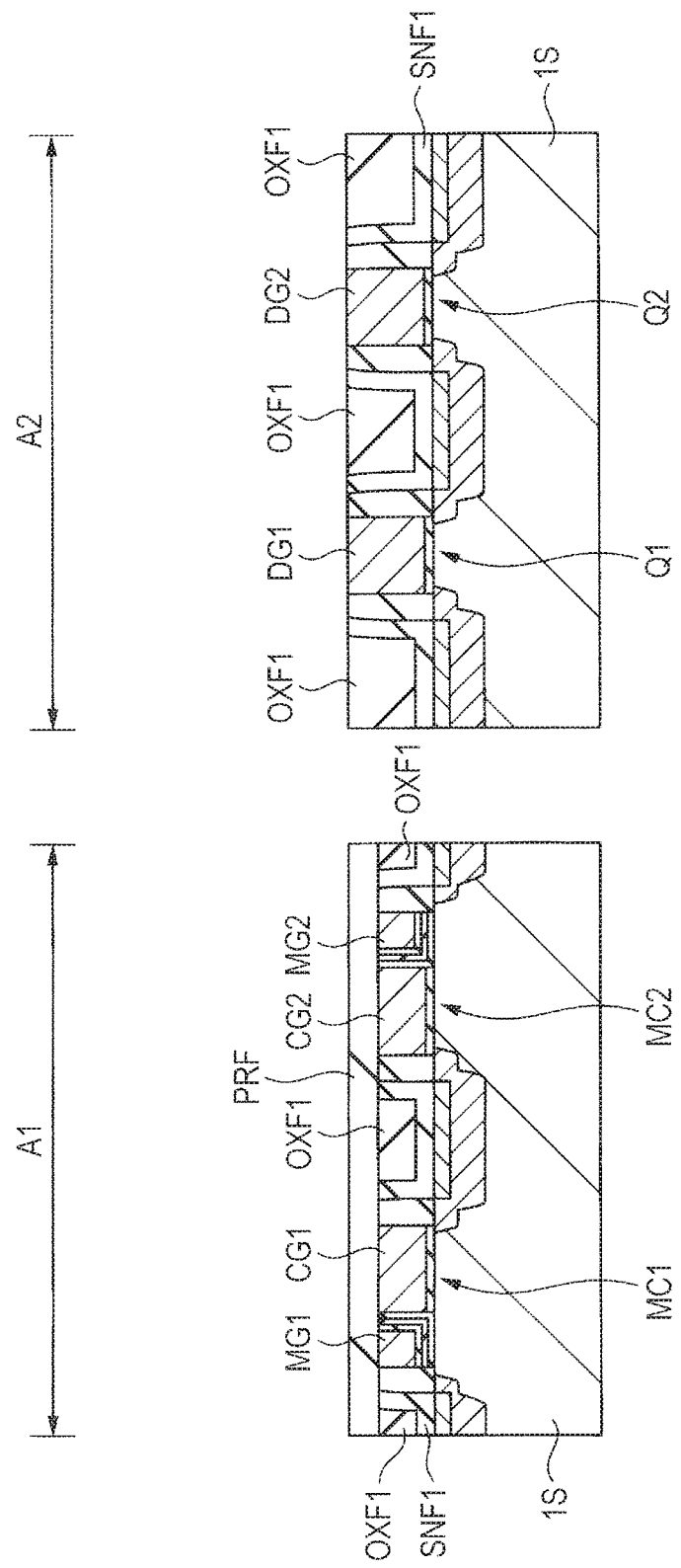
FIG. 6 is a sectional view which shows a step following the step shown in FIG. 5 in the process of manufacturing the semiconductor device.

After that, as shown in FIG. 5, a protective film PRF is formed to cover the control gate electrode CG1 (CG2) and memory gate electrode MG1 (MG2) of the memory cell MC1 (MC2) and the dummy gate electrode DG1 (DG2) of the field effect transistor Q1 (Q2). The protective film PRF is, for example, a silicon oxide film. Then, as shown in FIG.

6, using the photolithographic technique and etching technique, the protective film PRF1 in the field effect transistor formation area A2 is removed while leaving the protective film PRF1 in the memory cell formation area A1 unremoved.

Figure 7:
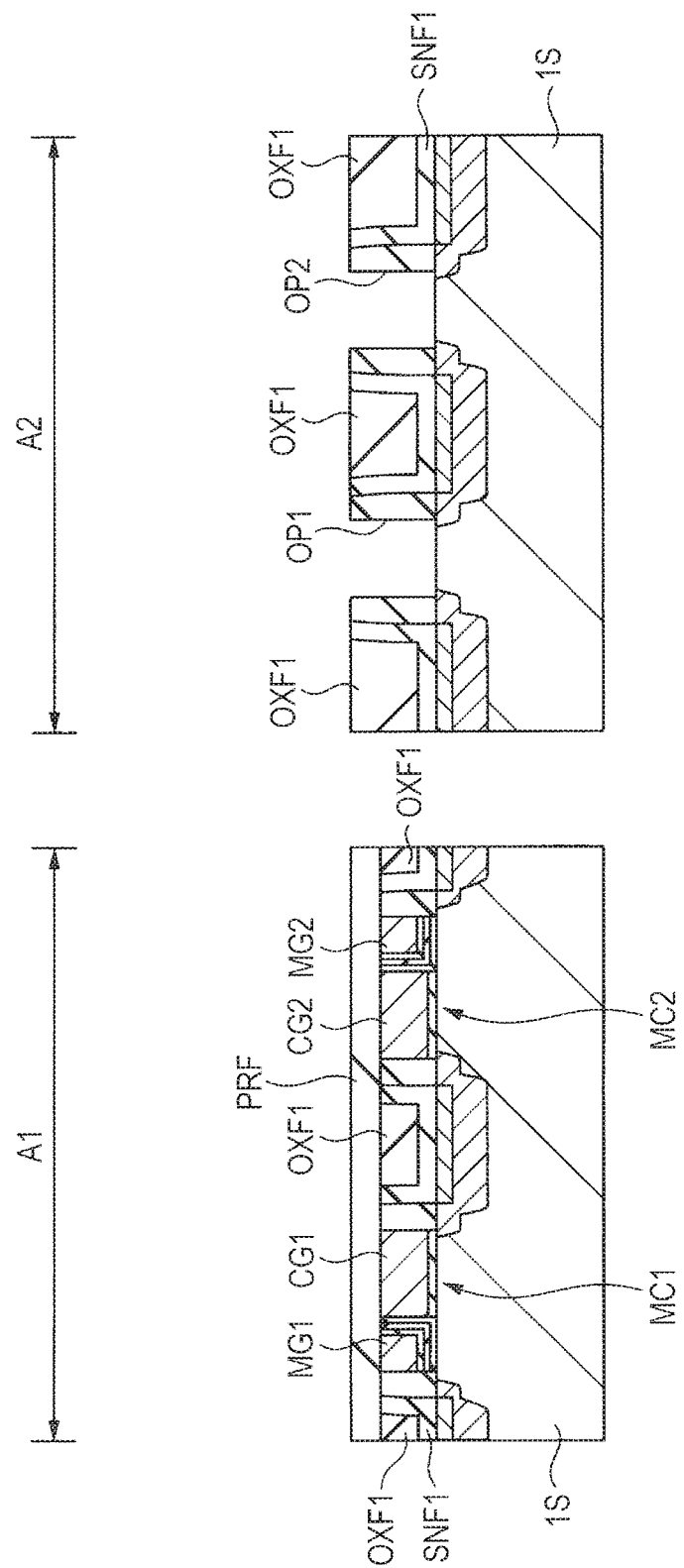
FIG. 7 is a sectional view which shows a step following the step shown in FIG. 6 in the process of manufacturing the semiconductor device.

Next, as shown in FIG. 7, for example, using the etching technique, the dummy gate electrode DG1 (DG2) and dummy gate insulating film which are exposed in the field effect transistor formation area A2 are removed and an opening OP1 and an opening OP2 are made. The dummy gate electrode DG1 (DG2) is, for example, made of polysilicon film and the dummy gate insulating film is a silicon oxide film.

Figure 8:
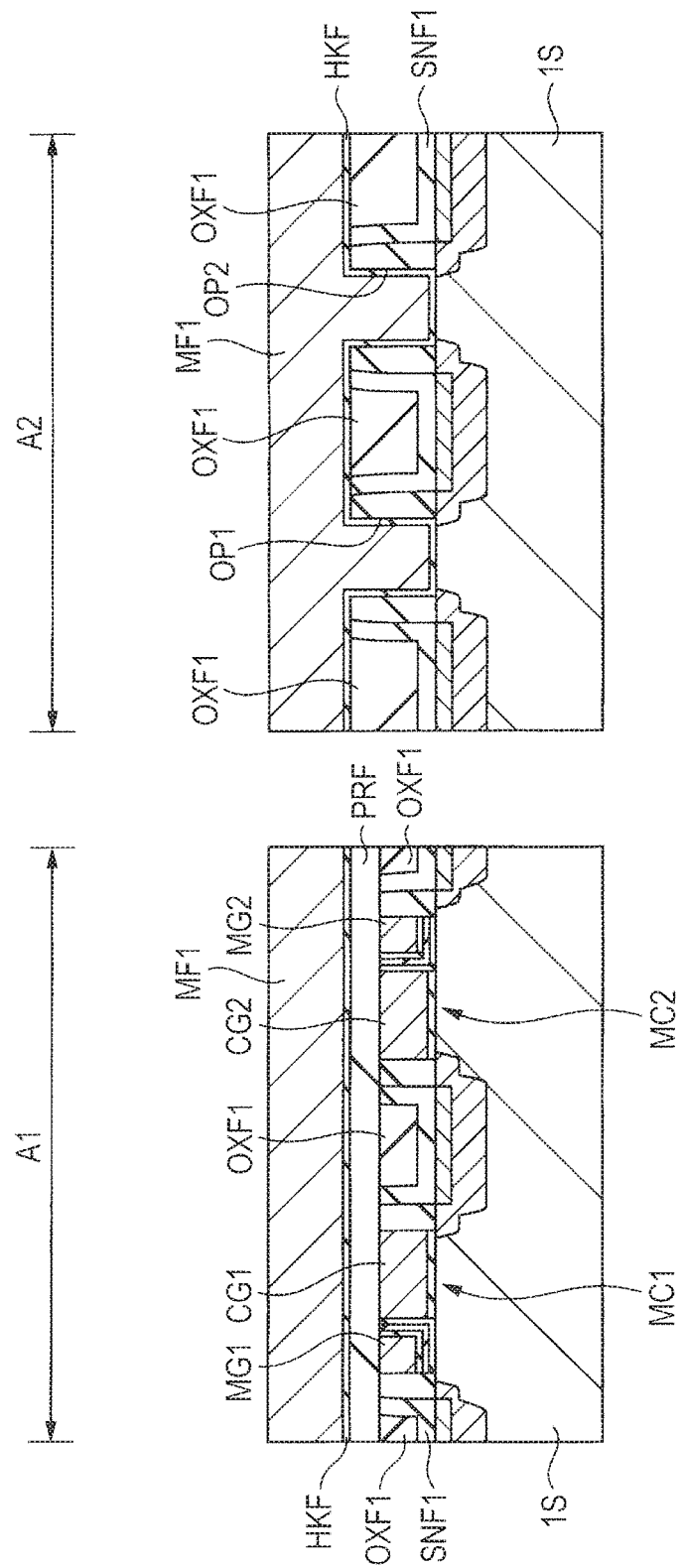
FIG. 8 is a sectional view which shows a step following the step shown in FIG. 7 in the process of manufacturing the semiconductor device.

Next, as shown in FIG. 8, a high-permittivity film HKF with a higher permittivity than a silicon oxide film is formed so as to cover the protective film PRF1 in the memory cell formation area A1 and the field effect transistor formation area A2 including the inner wall of the opening OP1 (OP2), and a metal-containing conductor film MF1 is formed over the high-permittivity film HKF. The high-permittivity film HKF is, for example, a hafnium oxide film. On the other hand, the metal-containing conductor film MF1 is, for example, an aluminum film (Al film), titanium film (Ti film), titanium nitride film (TiN film), titanium aluminum film (TiAl film) or tantalum nitride film (TaN film).

Figure 9:
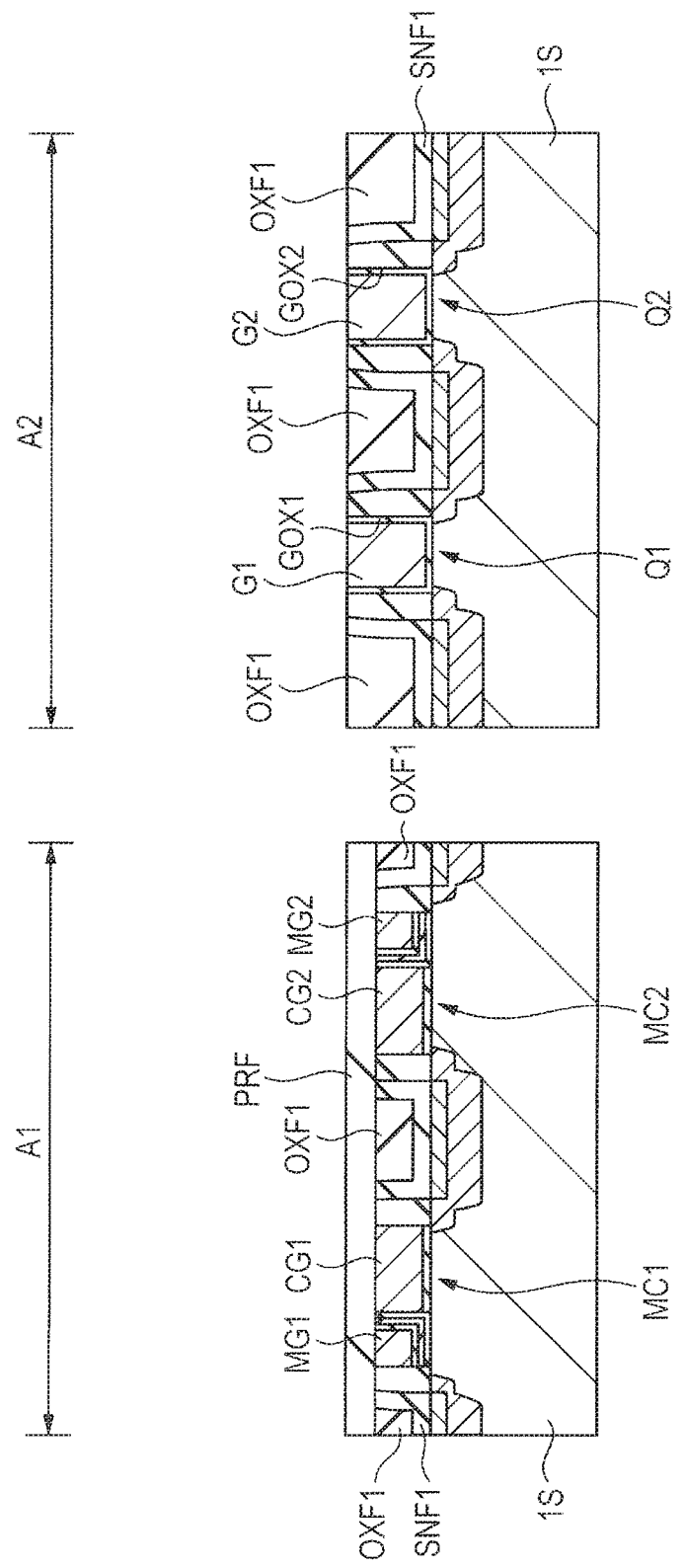
FIG. 9 is a sectional view which shows a step following the step shown in FIG. 8 in the process of manufacturing the semiconductor device.

Next, as shown in FIG. 9, using the CMP method, the high-permittivity film HKF and conductor film MF1 formed over the protective film PRF1 are removed while leaving the high-permittivity film HKF and conductor film MF1 in the opening OP1 (OP2) unremoved, so that a gate insulating film GOX1 (GOX2) and a gate electrode G1 (G2) are formed for a field effect transistor Q1 (Q2).

Figure 10:
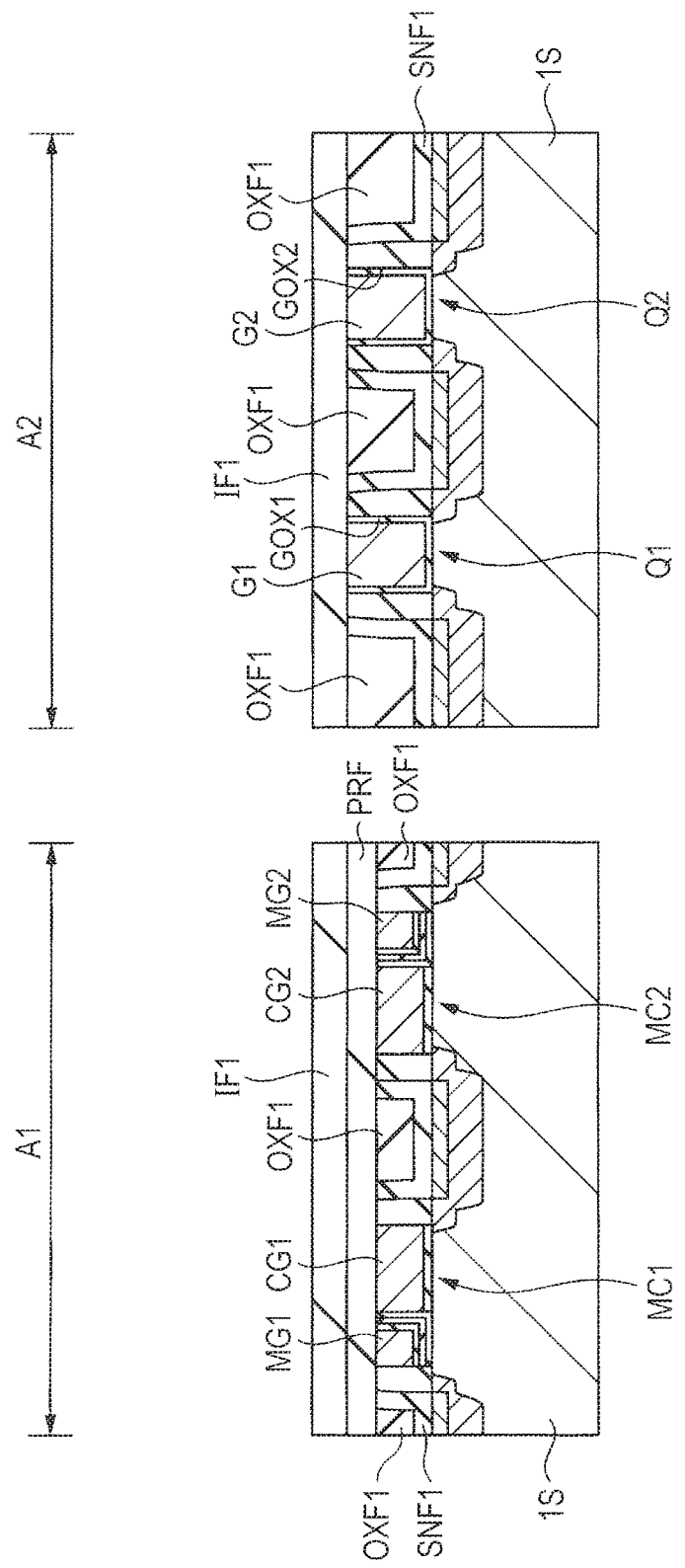
FIG. 10 is a sectional view which shows a step following the step shown in FIG. 9 in the process of manufacturing the semiconductor device.
Figure 11:
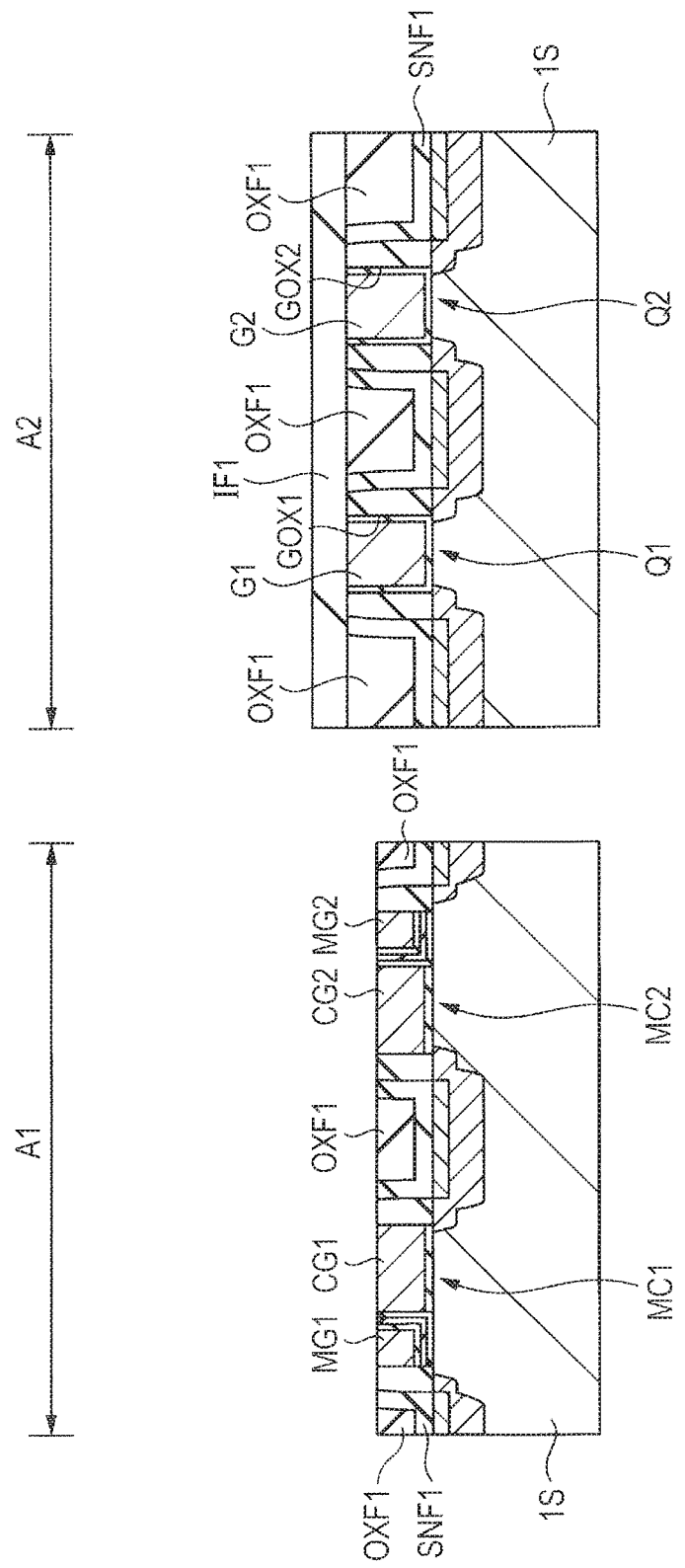
FIG. 11 is a sectional view which shows a step following the step shown in FIG. 10 in the process of manufacturing the semiconductor device.

After that, as shown in FIG. 10, an insulating film IF1 is formed so as to cover the protective film PRF1 in the memory cell formation area A1 and the field effect transistor formation area A2. The insulating film IF1 is, for example, a silicon oxide film. Then, as shown in FIG. 11, using the photolithographic technique and etching technique, the insulating film IF1 in the field effect transistor formation area A2 is left unremoved and the insulating film IF1 and protective film PRF1 in the memory cell formation area A1 are removed. As a consequence, as shown in FIG. 11, the upper surface of the control gate electrode CG1 (CG2) and the upper surface of the memory gate electrode MG1 (MG2) of the memory cell MC1 (MC2) are exposed.

Figure 12:
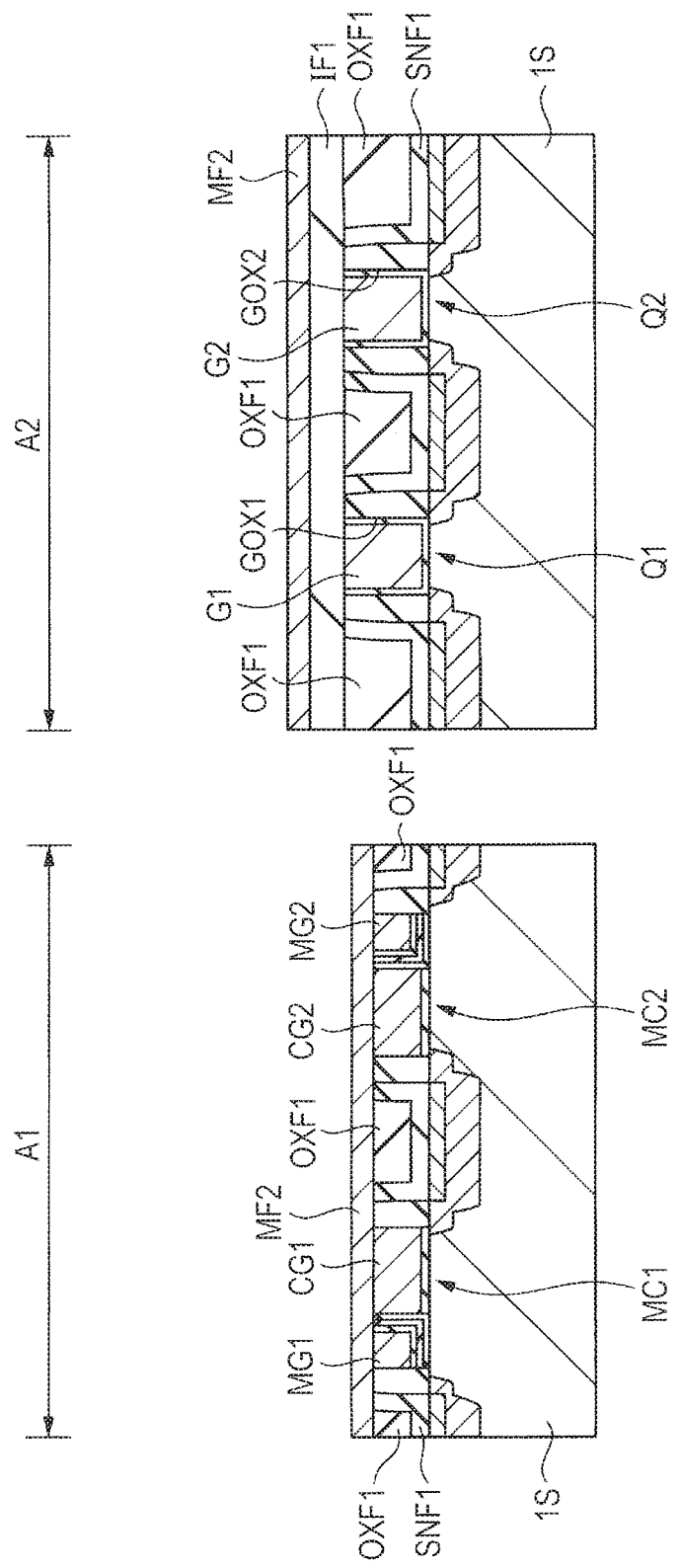
FIG. 12 is a sectional view which shows a step following the step shown in FIG. 11 in the process of manufacturing the semiconductor device.

Next, as shown in FIG. 12, a metal film MF2 is formed so as to cover the upper surface of the memory cell formation area A1 including the upper surface of the control gate electrode CG1 (CG2) and the upper surface of the memory gate electrode MG1 (MG2) of the memory cell MC1 (MC2) and the insulating film IF1 in the field effect transistor formation area A2. The metal film MF2 is, for example, a nickel platinum film (NiPt film).

Figure 13:
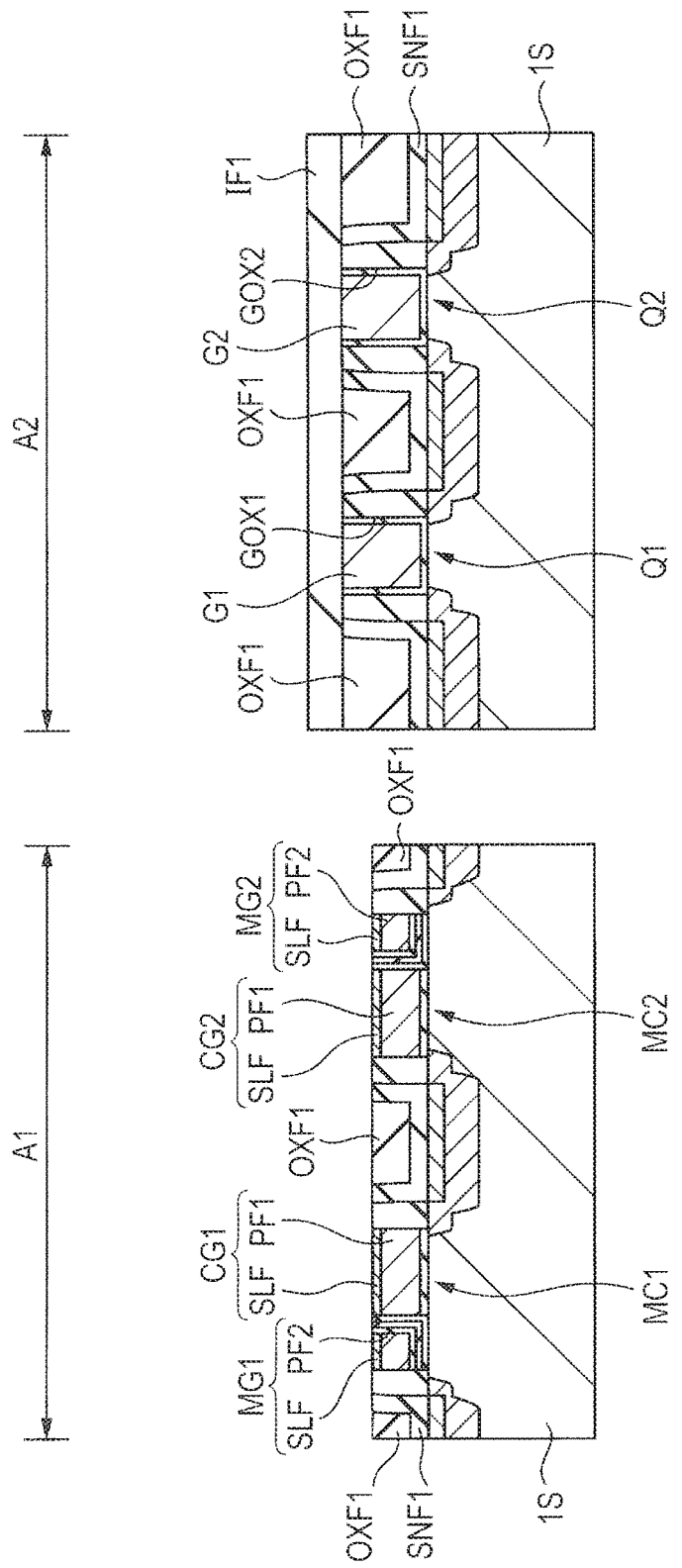
FIG. 13 is a sectional view which shows a step following the step shown in FIG. 12 in the process of manufacturing the semiconductor device.

Next, as shown in FIG. 13, the semiconductor substrate 1S is thermally treated so that the polysilicon film PF1 of the control gate electrode CG1 (CG2) and the polysilicon film PF2 of the memory gate electrode MG1 (MG2) react with the metal film MF2 to form a silicide film SLF on the upper surface of the control gate electrode CG1 (CG2) and the upper surface of the memory gate electrode MG1 (MG2). Consequently, as shown in FIG. 13, the control gate electrode CG1 (CG2) of the memory cell MC1 (MC2) is made of laminated film which includes the polysilicon film PF1 and silicide film SLF. Similarly, the memory gate electrode MG1 (MG2) of the memory cell MC1 (MC2) is made of laminated film which includes the polysilicon film PF2 and silicide film SLF.

Figure 14:
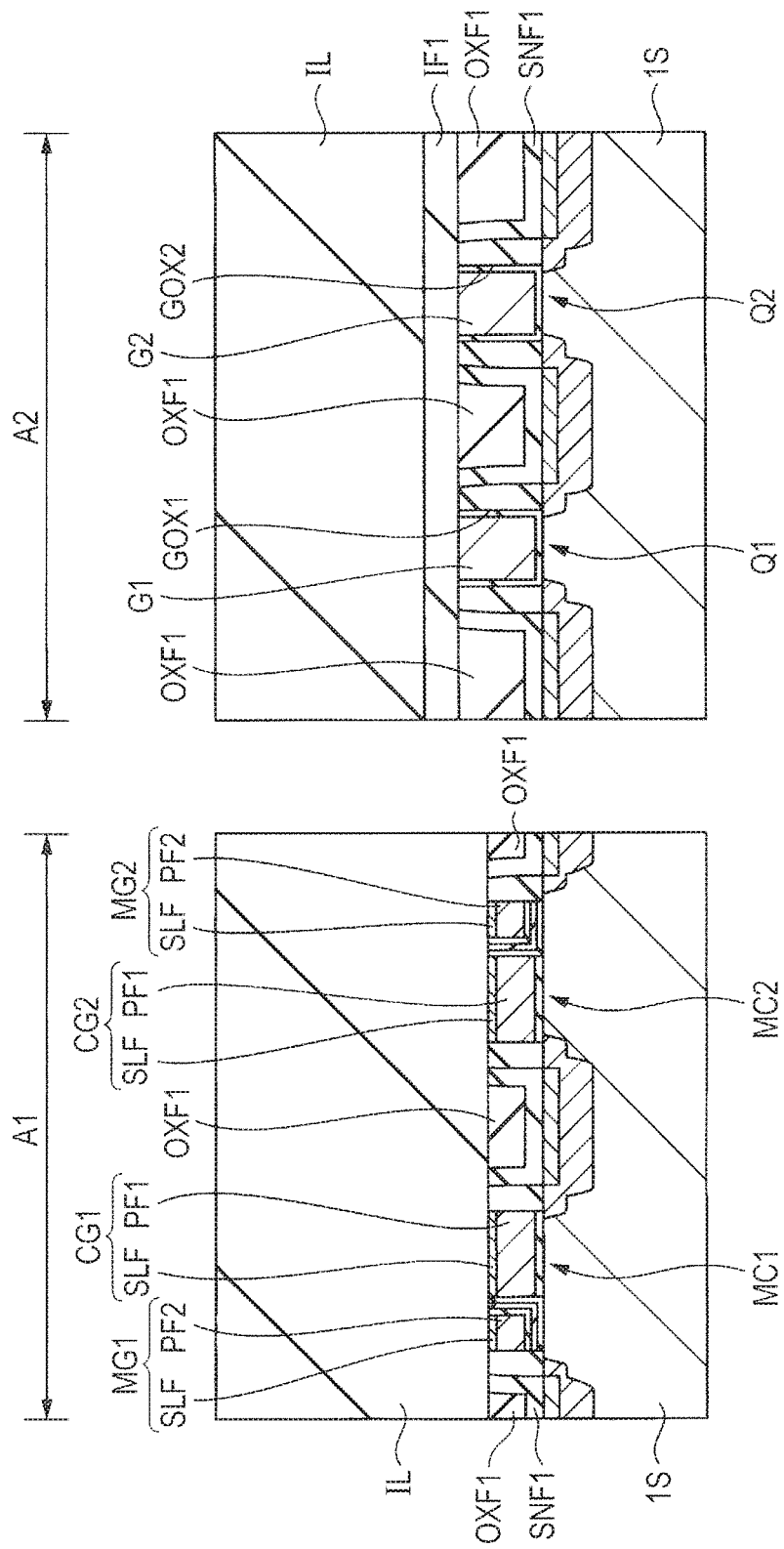
FIG. 14 is a sectional view which shows a step following the step shown in FIG. 13 in the process of manufacturing the semiconductor device.
Figure 15:
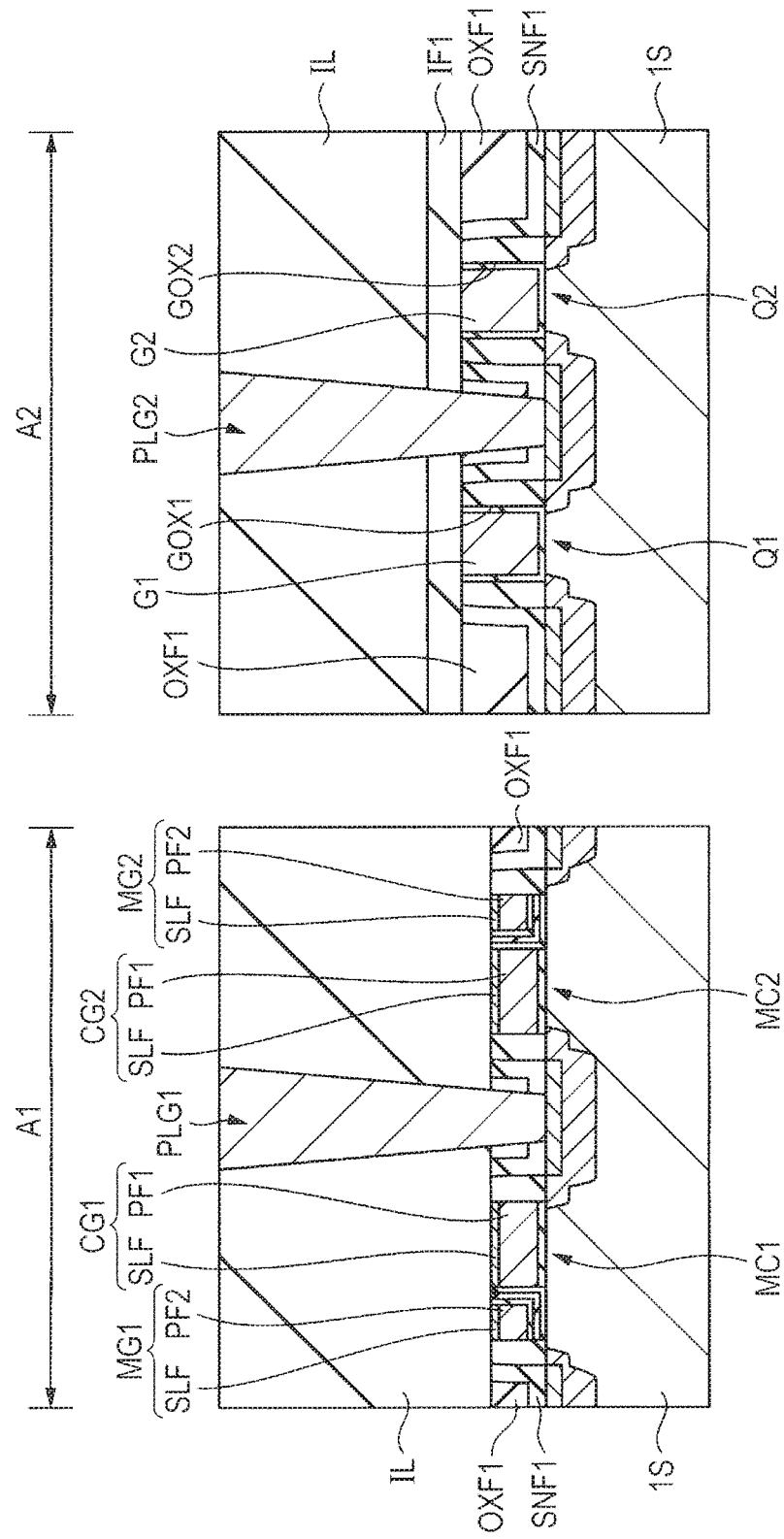
FIG. 15 is a sectional view which shows a step following the step shown in FIG. 14 in the process of manufacturing the semiconductor device.

Then, after the unreacted portion of the metal film MF2 is removed, an interlayer insulating film IL made of, for example, a silicon oxide film, is formed so as to cover the memory cell formation area A1 and the field effect transistor formation area A2 as shown in FIG. 14. Then, as shown in FIG. 15, contact holes which penetrate the interlayer insulating film IL and reach the front surface of the semiconductor substrate 1S are made using the photolithographic technique and etching technique. Then, a plug PLG1 (PLG2) is formed by burying a conductor film made of, for example, a tungsten film, in a contact hole. The semiconductor device according to the first embodiment is thus manufactured.

Features of the Manufacturing Method According to the First Embodiment

Next, the features of the manufacturing method according to the first embodiment will be explained. A first feature of the manufacturing method according to the first embodiment is that as shown in FIGS. 4 to 9, after the height position of the uppermost surface of the memory cell formation area A1 is made lower than the height position of the uppermost surface of the field effect transistor formation area A2 (see FIG. 4), the protective film PRF covering the memory cell formation area A1 is formed (see FIG. 6). Consequently, when the high-permittivity film HKF is formed after removal of the dummy gate electrode DG1 (DG2) (see FIG. 7), in the memory cell formation area A1 the control gate electrode CG1 (CG2) and memory gate electrode MG1 (MG2) of the memory cell MC1 (MC2) do not directly contact the high-permittivity film HKF (see FIG. 8). In short, according to the first feature of the first embodiment, the protective film PRF lies between the memory cell MC1 (MC2) and the high-permittivity film HKF. Thus, the first feature of the first embodiment suppresses the deterioration in the retention characteristics of the memory cell MC1 (MC2) which is attributable to direct contact between the memory cell MC1 (MC2) and the high-permittivity film HKF during the manufacturing process.

In other words, the first feature of the first embodiment is that the process of manufacturing a semiconductor device including a field effect transistor Q1 (Q2) with a metal gate electrode and a rewritable memory cell MC1 (MC2) includes the following steps, provided that the process includes the step of replacing a dummy gate electrode with a metal gate electrode. Specifically, the first feature of the first embodiment is that the process includes the step of making the height position of the uppermost surface of the memory cell formation area A1 lower than the height position of the uppermost surface of the field effect transistor formation area A2 (first step) and the step of, after the first step, forming the protective film PRF for covering the memory cell formation area A1 (second step).

The technical meaning of the first feature of the first embodiment is as follows. First, for example, the semiconductor device manufacturing process according to the first embodiment includes the step of making the height position of the uppermost surface of the memory cell formation area A1 the same as the height position of the uppermost surface of the field effect transistor formation area A2 (POP step) as shown in FIG. 2.

Alternatively, some related art may be that after the above POP step is carried out, the protective film PRF is formed over the memory cell formation area A1 without taking the first step (see FIG. 4). In other words, the related art described below, in which the protective film PRF is formed to cover the memory cell formation area A1, may be a possible approach from the viewpoint of suppressing the deterioration in the retention characteristics of the memory cell MC1 (MC2) which is attributable to direct contact between the memory cell MC1 (MC2) and the high-permittivity film HKF.

Specifically, after the step shown in FIG. 2 is carried out, a protective film PRF is formed so as to cover the memory cell formation area A1 and the field effect transistor formation area A2 without taking the first step of making the height position of the uppermost surface of the memory cell formation area A1 lower than the height position of the uppermost surface of the field effect transistor formation area A2. Then, using the photolithographic technique, the protective film PRF in the field effect transistor formation area A2 is removed while leaving the protective film PRF in the memory cell formation area A1 unremoved. Then, the dummy gate electrode DG1 (DG2) in the field effect transistor formation area A2 is removed and then a high-permittivity film HKF and a conductor film MF1 are formed so as to cover the protective film PRF in the memory cell formation area A1 and the field effect transistor formation area A2 where the dummy gate electrode DG1 (DG2) has been removed. Also in this related art, the protective film PRF lies between the memory cell MC1 (MC2) and the high-permittivity film HKF. Thus, this related art can also be considered to suppress the deterioration in the retention characteristics of the memory cell MC1 (MC2) which is attributable to direct contact between the memory cell MC1 (MC2) and the high-permittivity film HKF.

Next, using the CMP method, a gate insulating film GOX1 (GOX2) and a gate electrode G1 (G2) for a field effect transistor Q1 (Q2) are formed by leaving the high-permittivity film HKF and conductor film MF1 unremoved only inside the opening OP1 (OP2).

In this related art, if the CMP method is carried out as mentioned above, the upper surface of the control gate electrode CG1 (CG2) and the upper surface of the memory gate electrode MG1 (MG2) of the memory cell MC1 (MC2) in the memory cell formation area A1 would be exposed.

By contrast, in the semiconductor device manufacturing method according to the first embodiment, after taking the step shown in FIG. 2, the first step shown in FIGS. 3 and 4 is carried out. Therefore, for example, when carrying out the step of leaving the high-permittivity film HKF and conductor film MF1 unremoved only inside the opening OP1 (OP2) using the CMP method as shown in FIG. 9, the upper surface of the control gate electrode CG1 (CG2) and the upper surface of the memory gate electrode MG1 (MG2) of the memory cell MC1 (MC2) are held covered by the protective film PRF. As a consequence, the first embodiment can reliably suppress the deterioration in the retention characteristics of the memory cell MC1 (MC2) which is attributable to exposure of the upper surface of the control gate electrode CG1 (CG2) and the upper surface of the memory gate electrode MG1 (MG2) of the memory cell MC1 (MC2). In other words, the first feature of the first embodiment is to prevent the upper surface of the control gate electrode CG1 (CG2) and the upper surface of the memory gate electrode MG1 (MG2) of the memory cell MC1 (MC2) from being exposed after the step shown in FIG. 2 and also prevent direct contact between the memory cell MC1 (MC2) and the high-permittivity film HKF. Thus, according to the first embodiment, the deterioration in the retention characteristics of the memory cell MC1 (MC2) can be suppressed.

In order to suppress the deterioration in the retention characteristics of the memory cell MC1 (MC2), the first feature of the first embodiment takes both a measure to prevent direct contact between the memory cell MC1 (MC2) and the high-permittivity film HKF and a measure to prevent exposure of the upper surface of the control gate electrode CG1 (CG2) and the upper surface of the memory gate electrode MG1 (MG2) after the step shown in FIG. 2. In this aspect, the first feature of the first embodiment is different from the above related art which focuses only prevention of direct contact between the memory cell MC1 (MC2) and the high-permittivity film HKF.

This means that the present inventors consider the deterioration in the retention characteristics of the memory cell MC1 (MC2) attributable not only to direct contact between the memory cell MC1 (MC2) and the high-permittivity film HKF (finding 1) but also to exposure of the upper surface of the control gate electrode CG1 (CG2) and the upper surface of the memory gate electrode MG1 (MG2) after the step shown in FIG. 2 (finding 2). The first feature of the first embodiment is conceived based on these findings 1 and 2.

As mentioned above, the first feature of the first embodiment lies in combining the step of making the height position of the uppermost surface of the memory cell formation area A1 lower than the height position of the uppermost surface of the field effect transistor formation area A2 (first step) and the step of, after the first step, forming the protective film PRF to cover the memory cell formation area A1 (second step). The first feature of the first embodiment has a significant technical meaning in the sense that it can solve both the causes of deterioration in the retention characteristics which are related to the findings 1 and 2.

Next, a second feature of the first embodiment will be explained. The second feature of the first embodiment is a countermeasure against an adverse effect of the adoption of the first feature of the first embodiment. Next, the adverse effect of adoption of the first feature of the first embodiment will be first described and then the second feature of the first embodiment as a countermeasure against the adverse effect will be described.

As shown in FIG. 1, a cap insulating film is formed over the control gate electrode CG1 (CG2) of the memory cell MC1 (MC2) in the memory cell formation area A1. Although not shown in FIG. 1, the control gate electrode CG1 (CG2) of the memory cell MC1 (MC2) extends to the power supply region not shown in FIG. 1. In the power supply region, an opening is made in the cap insulating film formed over the control gate electrode CG1 (CG2) and a silicide film is formed on the upper surface of the control gate electrode CG1 (CG2) exposed from the opening. In the power supply region, a plug coupled to the control gate electrode CG1 (CG2) through the silicide film is formed and due to the existence of the silicide film, the coupling resistance between the control gate electrode CG1 (CG2) and the plug is decreased. Similarly, in the power supply region, a plug coupled to the memory gate electrode MG1 (MG2) through the silicide film is formed and due to the existence of the silicide film, the coupling resistance between the memory gate electrode MG1 (MG2) and the plug is decreased.

In this respect, if the first feature of the first embodiment is adopted, for example, the step of polishing the surface of the memory cell formation area A1 may be taken to make the height position of the uppermost surface of the memory cell formation area A1 lower than the height position of the uppermost surface of the field effect transistor formation area A2 as shown in FIG. 4. This means that the silicide film formed on the upper surface of the control gate electrode CG1 (CG2) is removed in the power supply region. Therefore, if the first feature of the first embodiment is adopted, the silicide film on the upper surface of the control gate electrode CG1 (CG2) would be removed in the power supply region, resulting in the adverse effect that the coupling resistance between the control gate electrode CG1 (CG2) and the plug would increase. For this reason, the first embodiment takes a measure to prevent the adverse effect of adoption of the first feature. The measure to prevent the adverse effect of adoption of the first feature is the second feature of the first embodiment. The second feature of the first embodiment is as follows.

The second feature of the first embodiment lies in including, for example, the step of silicidizing the upper surface of the control gate electrode CG1 (CG2) and the upper surface of the memory gate electrode MG1 (MG2) of the memory cell MC1 (MC2) as shown in FIGS. 10 to 13 after carrying out the step of replacing the dummy gate electrode DG1 (DG2) with the metal gate electrode (gate electrode G1 (G2)). Consequently, according to the second feature of the first embodiment, the entire upper surface of the control gate electrode CG1 (CG2) and the entire upper surface of the memory gate electrode MG1 (MG2) are silicidized. Thus, also in the power supply region, the upper surface of the control gate electrode CG1 (CG2) and the upper surface of the memory gate electrode MG1 (MG2) are silicidized. Consequently, the second feature of the first embodiment suppresses the increase in the coupling resistance between the control gate electrode CG1 (CG2) and the plug and also suppresses the increase in the coupling resistance between the memory gate electrode MG1 (MG2) and the plug. In short, the second feature of the first embodiment prevents the adverse effect of adoption of the first feature.

Furthermore, according to the second feature of the first embodiment, the entire upper surface of the control gate electrode CG1 (CG2) not only in the power supply region but also in the region other than the power supply region is silicidized. Thus, according to the second feature of the first embodiment, the resistance of the control gate electrode CG1 (CG2) can be decreased, so that the performance of the memory cell MC1 (MC2) can be improved.

A third feature of the first embodiment is that the control gate electrode CG1 (CG2) and the memory gate electrode MG1 (MG2) are entirely silicidized, for example, provided that the above second feature is adopted. In other words, the third feature of the first embodiment lies in fully silicidizing the control gate electrode CG1 (CG2) and memory gate electrode MG1 (MG2). Therefore, according to the third feature of the first embodiment, the resistance of the control gate electrode CG1 (CG2) of the memory cell MC1 (MC2) can be decreased and the resistance of the memory gate electrode MG1 (MG2) of the memory cell MC1 (MC2) can be decreased. Thus, according to the third feature of the first embodiment, the performance of the memory cell MC1 (MC2) can be further improved.

The third feature of the first embodiment can be implemented because the manufacturing process includes the step of making the height position of the uppermost surface of the memory cell formation area A1 lower than the height position of the uppermost surface of the field effect transistor formation area A2 (first step). Although the amount of nonselective etching at the first step is approximately 20 nm to 40 nm, preferably the amount of nonselective etching should be approximately 40 nm from the viewpoint of fully silicidizing the control gate electrode CG1 (CG2) and memory gate electrode MG1 (MG2).

<Variation 1>

Next, Variation 1 of the first embodiment will be described. In Variation 1, as a means to make the height position of the uppermost surface of the memory cell formation area A1 lower than the height position of the uppermost surface of the field effect transistor formation area A2, oxidation of the uppermost surface of the memory cell formation area A1 is performed instead of using nonselective etching (dry etching).

Figure 16:
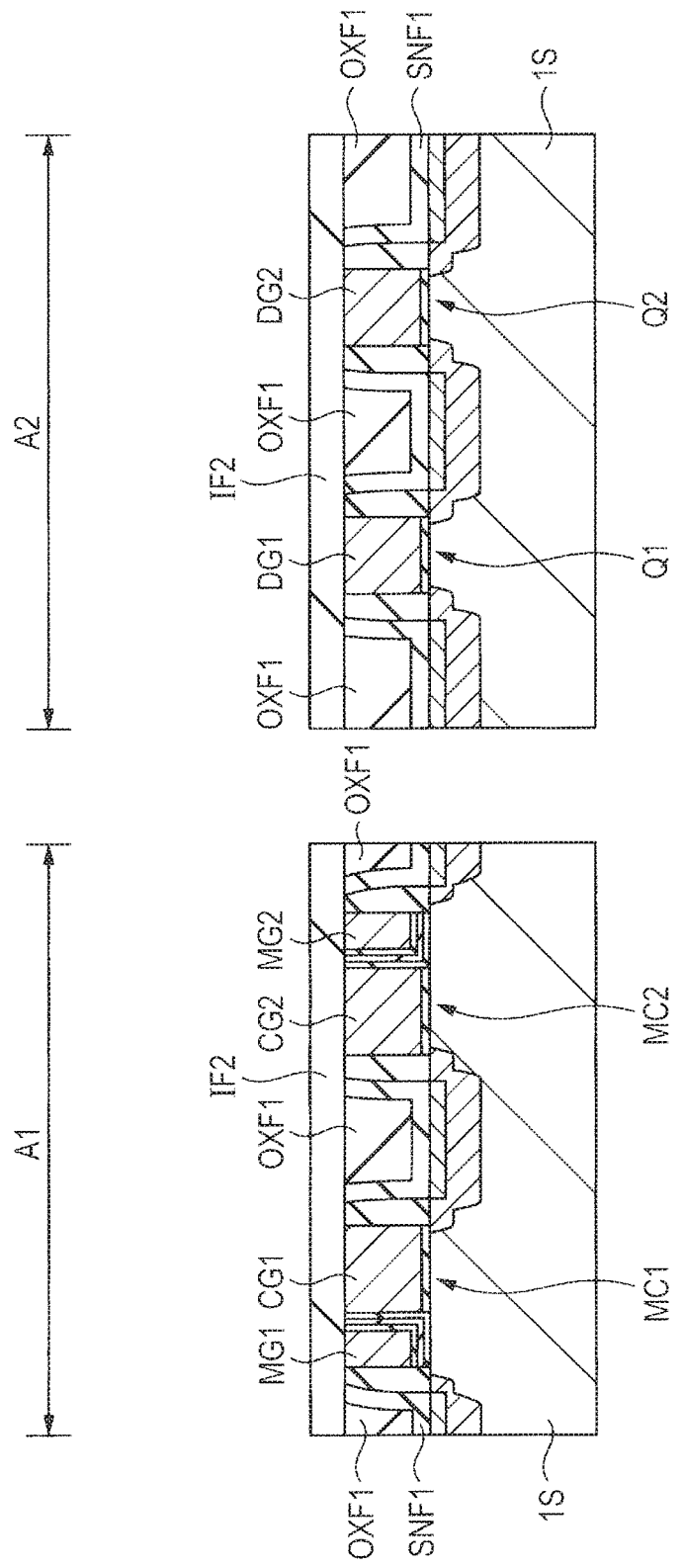
FIG. 16 is a sectional view which shows a step in the process of manufacturing a semiconductor device according to Variation 1 of the first embodiment.
Figure 17:
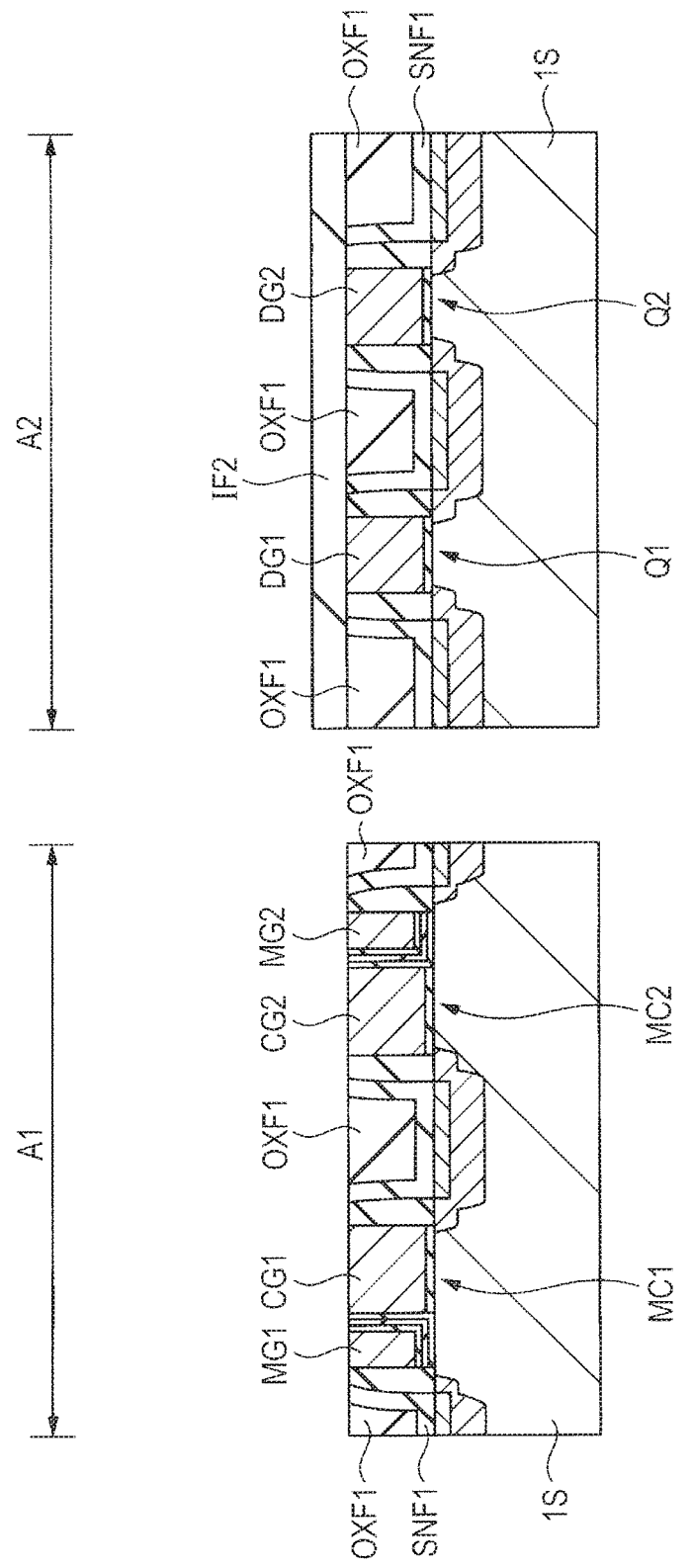
FIG. 17 is a sectional view which shows a step following the step shown in FIG. 16 in the process of manufacturing the semiconductor device.
Figure 18:
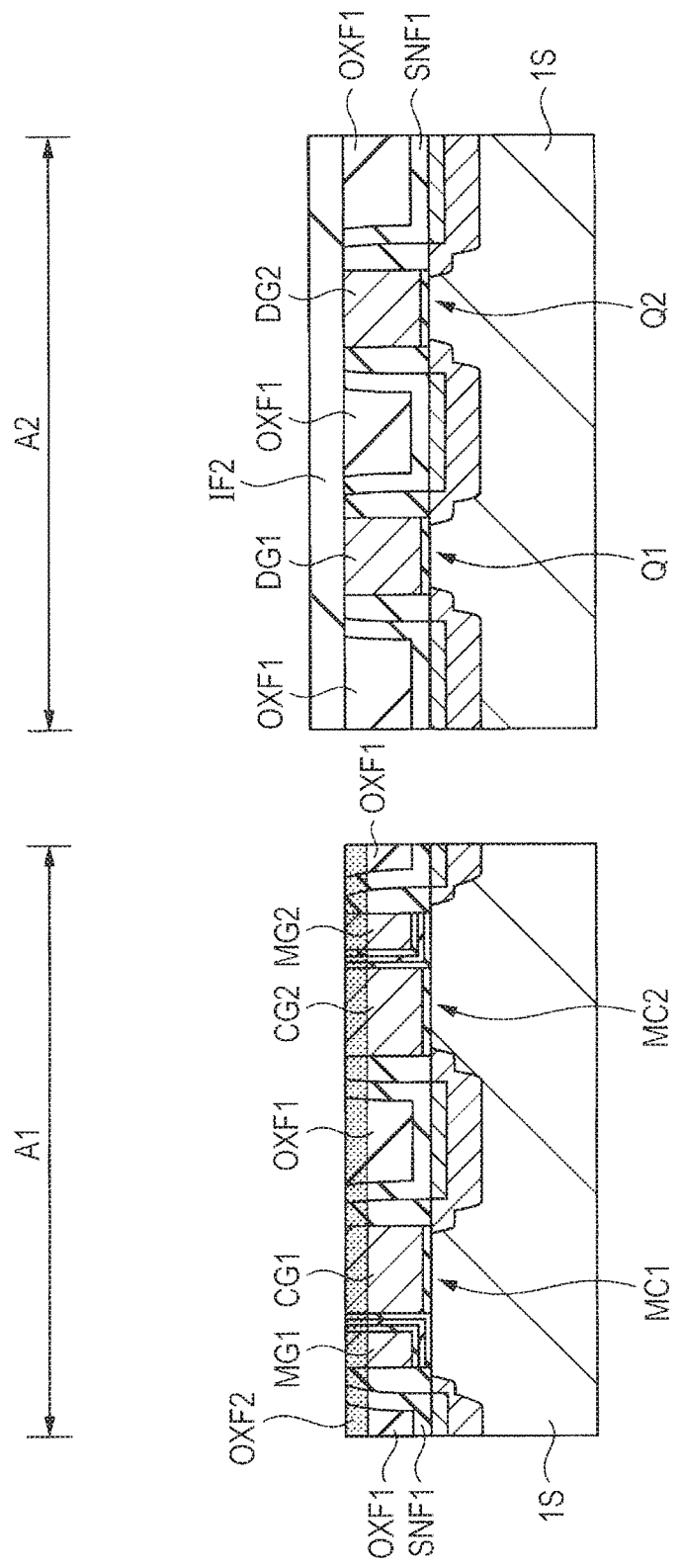
FIG. 18 is a sectional view which shows a step following the step shown in FIG. 17 in the process of manufacturing the semiconductor device.

In Variation 1, after the step shown in FIG. 2 is carried out, an insulating film IF2, for example, a silicon oxide film, is formed so as to cover the memory cell formation area A1 and the field effect transistor formation area A2 as shown in FIG. 16. Then, as shown in FIG. 17, the insulating film IF2 in the memory cell formation area A1 is removed using the photolithographic technique and etching technique. Then, as shown in FIG. 18, the surface of the memory cell formation area A1 is oxidized by the plasma oxidation method or ISSG oxidation method with a heating temperature of 500° C. or less. Then, by taking the subsequent steps which are almost the same as the semiconductor device manufacturing steps shown in FIGS. 7 to 15 in the first embodiment, the semiconductor device according to Variation 1 is manufactured.

The first feature of the first embodiment is to include the step of making the height position of the uppermost surface of the memory cell formation area A1 lower than the height position of the uppermost surface of the field effect transistor formation area A2 (first step) and the step of, after the first step, forming the protective film PRF to cover the memory cell formation area A1 (second step). On the other hand, in Variation 1, the oxidation process shown in FIGS. 16 to 18 corresponds to the combination of the first step and the second step in the first embodiment. Therefore, the semiconductor device manufacturing method according to Variation 1 brings about the same advantageous effects as the first embodiment and simplifies the manufacturing process as compared with the first embodiment.

<Variation 2>

<<Basic Idea>>

Next, Variation 2 of the first embodiment will be described. The basic idea of Variation 2 is to apply the semiconductor device manufacturing method according to the first embodiment not to all the memory cells in one semiconductor chip, but apply the method to some of the memory cells.

In some cases, a plurality of memories with different functions are formed in one semiconductor chip. Specifically, one semiconductor chip may include a memory to be rewritten a relatively large number of times or frequently and a memory to be rewritten a relatively small number of times or less frequently. In this case, the deterioration in the retention characteristics is more likely to arise in the memory rewritten frequently than in the memory rewritten less frequently. For this reason, in Variation 2, for a semiconductor device including, for example, a first memory and a second memory which are different in the frequency of rewriting, the semiconductor device manufacturing method according to the first embodiment is applied to the memory cell of the first memory to be rewritten frequently and the ordinary semiconductor device manufacturing method is applied to the memory cell of the second memory to be rewritten less frequently.

According to Variation 2 based on the above basic idea, the retention characteristics of the memory to be rewritten frequently can be improved by the minimum modification of the manufacturing process.

<<Device Structure>>

Figure 19:
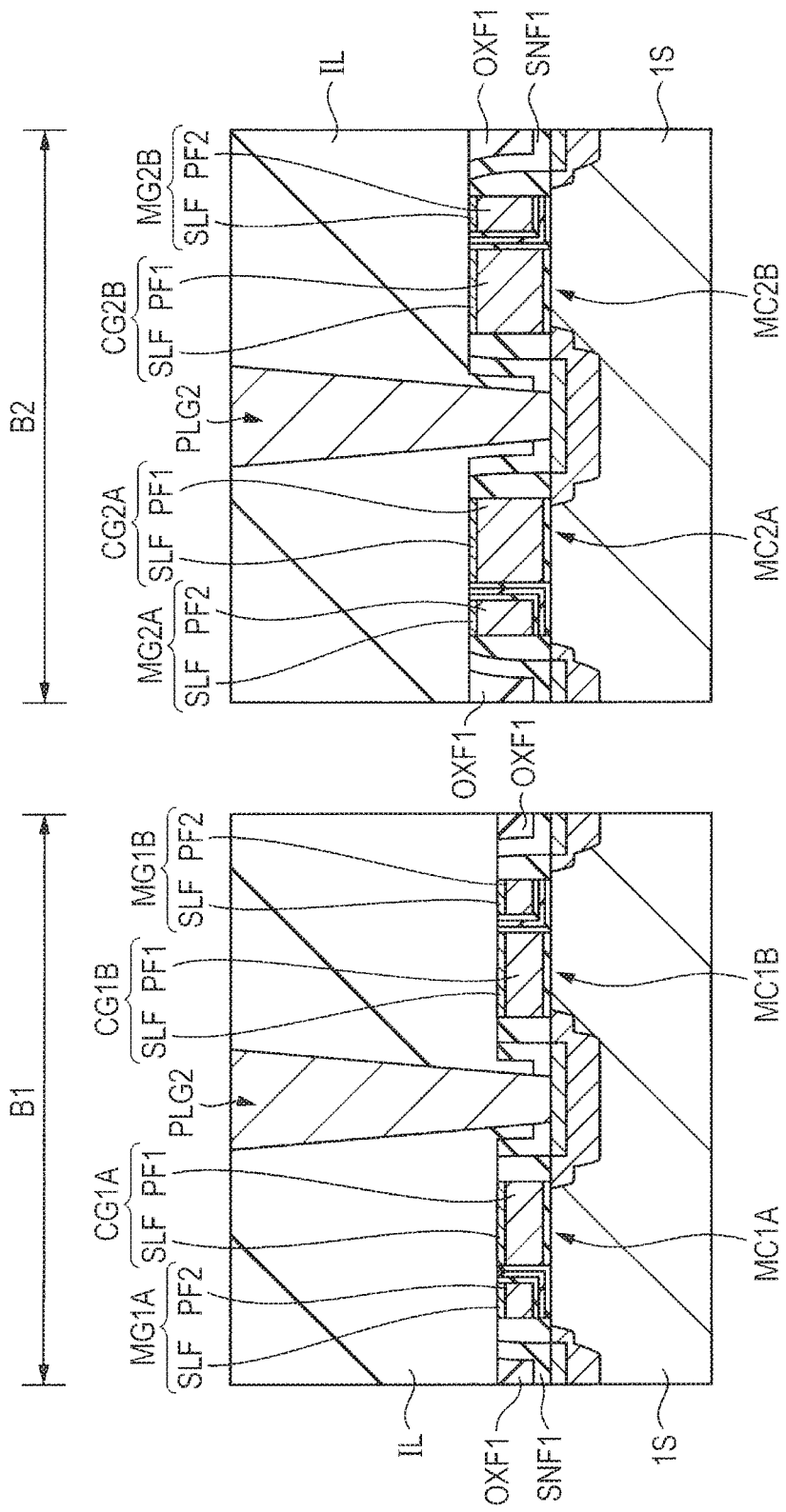
FIG. 19 is a sectional view of the device structure of a semiconductor device according to Variation 2 of the first embodiment.

Next, the structure of the semiconductor device which embodies the basic idea of Variation 2 will be explained. FIG. 19 schematically shows the structure of the semiconductor device according to Variation 2. As shown in FIG. 19, one semiconductor chip includes a memory cell formation area B1 and a memory cell formation area B2. A memory cell MC1A (MC1B) which configures the first memory to be rewritten frequently is formed in the memory cell formation area B1 and a memory cell MC2A (MC2B) which configures the second memory to be rewritten less frequently is formed in the memory cell formation area B2. The memory cell MC1A (MC1B) and memory cell MC2A (2B) are both rewritable nonvolatile memory cells and have a charge storage film which stores information. The charge storage film is located at least under a memory gate electrode MG1 (MG2). The charge storage film is, for example, an insulating film with a trap level. Specifically, the charge storage film of the memory cell MC1A (MC1B) is a silicon nitride film and the charge storage film of the memory cell MC2A (MC2B) is also a silicon nitride film.

Here, regarding the memory cell formation area B1 and memory cell formation area B2, the semiconductor device manufacturing method according to the first embodiment is applied to the memory cell formation area B1. Consequently, as shown in FIG. 19, the semiconductor device according to Variation 2 has a memory cell MC1A (MC1B) which is formed in the memory cell formation area B1 and includes a control gate electrode CG1A (CG1B) and a memory gate electrode MG1A (MG1B). At the same time, the semiconductor device according to Variation 2 has a memory cell MC2A (MC2B) which is formed in the memory cell formation area B2 and includes a control gate electrode CG2A (CG2B) and a memory gate electrode MG2A (MC2B). Here, the upper surface position of the control gate electrode CG1A (CG1B) is lower than the upper surface position of the control gate electrode CG2A (CG2B) and the upper surface position of the memory gate electrode MG1A (MG1B) is lower than the upper surface position of the memory gate electrode MG2A (MC2B) (difference 1).

In addition, in the semiconductor device shown in FIG. 19, the height size of the control gate electrode CG1A (CG1B) is smaller than the height size of the control gate electrode CG2A (CG2B) and the height size of the memory gate electrode MG1A (MG1B) is smaller than the height size of the memory gate electrode MG2A (MG2B) (difference 2). In the semiconductor device shown in FIG. 19 in particular, the control gate electrode CG1A (CG1B) and memory gate electrode MG1A (MG1B) of the memory cell MC1A (MC1B) may be each made of silicide film (full silicide electrode). On the other hand, the control gate electrode CG2A (CG2B) and memory gate electrode MG2A (MG2B) of the memory cell MC2A (MC2B) are each made of laminated film which includes a polysilicon film and a silicide film (partial silicide electrode) (difference 3).

Thus, when the basic idea of Variation 2 is adopted, the semiconductor device according to Variation 2 which embodies the basic idea includes a plurality of memories which at least have the above differences 1 and 2 and are different from each other in the memory cell device structure.

Second Embodiment

In the second embodiment, after a substrate is formed into a stepped shape in advance, the lower level area is used as a memory cell formation area and the upper level area is used as a field effect transistor formation area so that the height position of the uppermost surface of a memory cell formed in the memory cell formation area is lower than the height position of the uppermost surface of a field effect transistor formed in the field effect transistor area. The manufacturing method according to the second embodiment will be described referring to drawings.

<Semiconductor Device Manufacturing Method>

Figure 20:
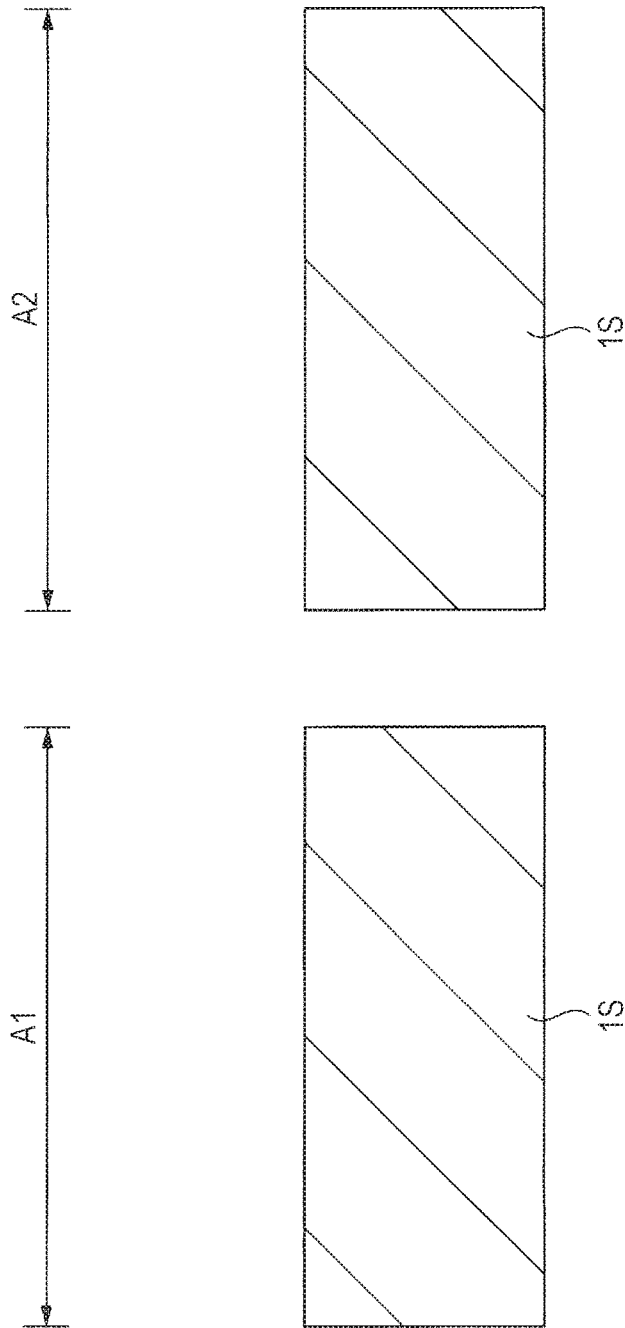
FIG. 20 is a sectional view which shows a step in the process of manufacturing a semiconductor device according to a second embodiment of the invention.

First, as shown in FIG. 20, a semiconductor substrate 1S has a memory cell formation area A1 and a field effect transistor formation area A2. At this time, the front surface of the semiconductor substrate 1S in the memory cell formation area A1 is flush with the front surface of the semiconductor substrate 1S in the field effect transistor formation area A2 as shown in FIG. 20.

Figure 21:
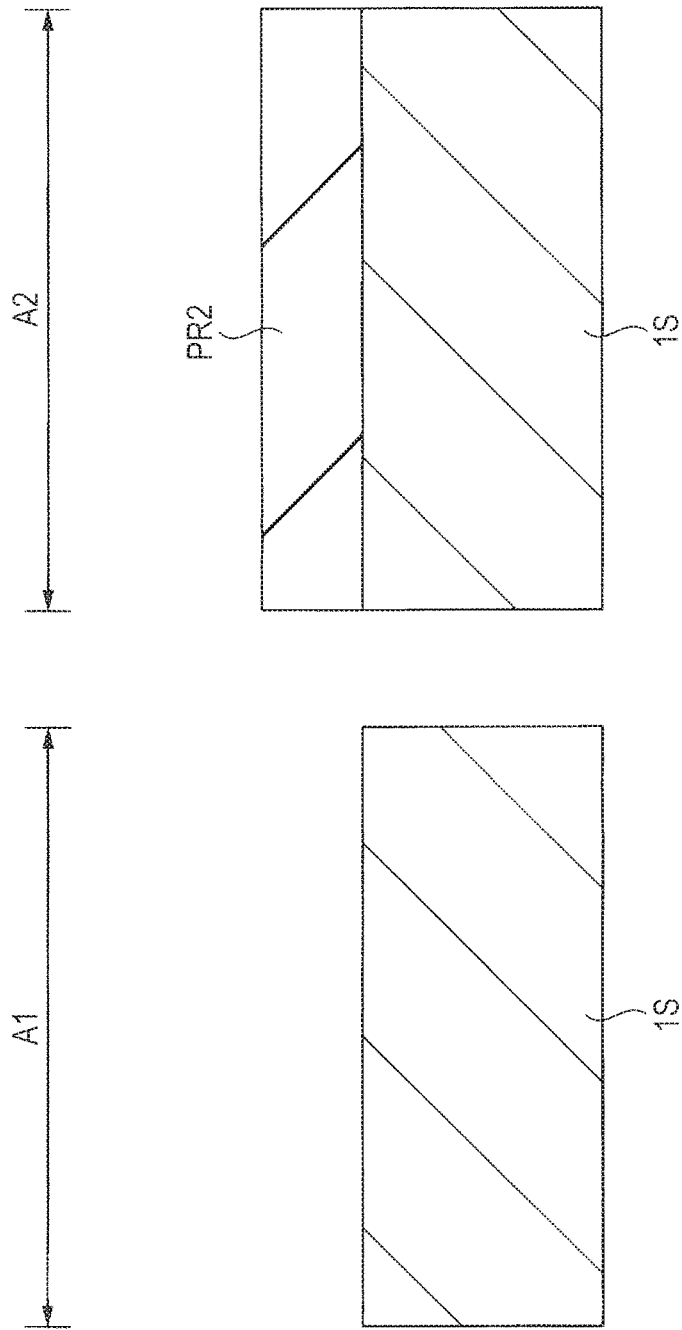
FIG. 21 is a sectional view which shows a step following the step shown in FIG. 20 in the process of manufacturing the semiconductor device.
Figure 22:
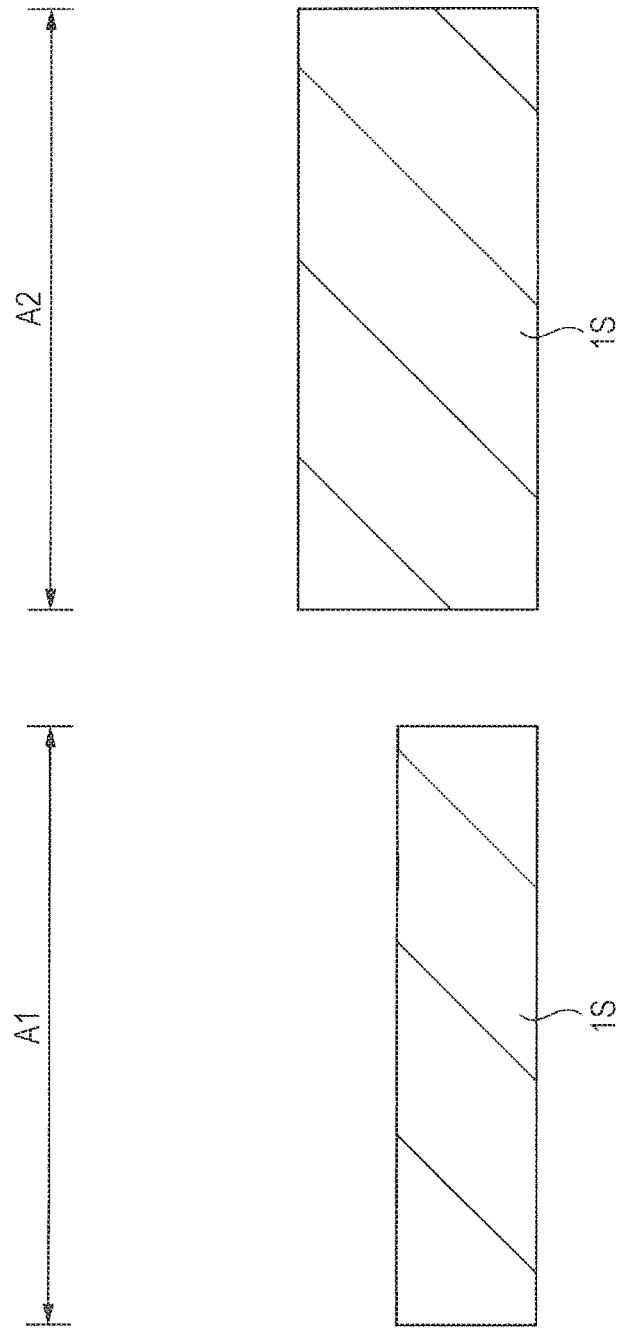
FIG. 22 is a sectional view which shows a step following the step shown in FIG. 21 in the process of manufacturing the semiconductor device.

Next, as shown in FIG. 21, using the photolithographic technique, a resist film PR2 is formed only over the front surface of the semiconductor substrate 1S in the field effect transistor formation area A2. Then, as shown in FIG. 22, the thickness of the semiconductor substrate 1S in the memory cell formation area A1 which is exposed from the patterned resist film PR2 is decreased by etching using the patterned resist film PR2 as a mask. Consequently, the upper surface (front surface) of the semiconductor substrate 1S in the memory cell formation area A1 is made lower than the upper surface (front surface) of the semiconductor substrate 1S in the field effect transistor formation area A2.

Figure 23:
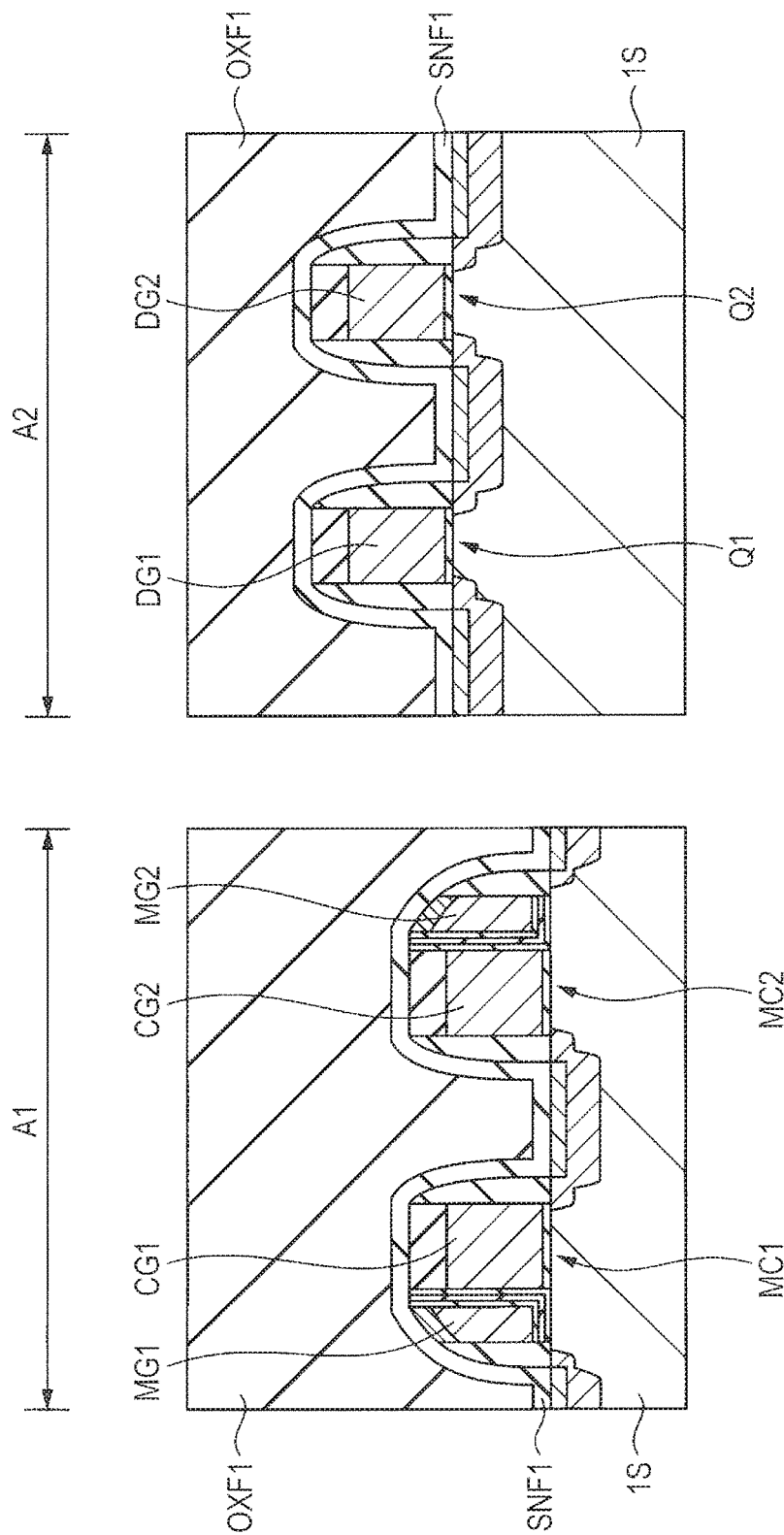
FIG. 23 is a sectional view which shows a step following the step shown in FIG. 22 in the process of manufacturing the semiconductor device.

Next, as shown in FIG. 23, a memory cell MC1 (MC2) including a control gate electrode CG1 (CG2) and a memory gate electrode MG1 (MG2) is formed in the memory cell formation area A1 and a field effect transistor Q1 (Q2) including a dummy gate electrode DG1 (DG2) is formed in the field effect transistor formation area A2. At this time, as shown in FIG. 23, the upper surface position of the control gate electrode CG1 (CG2) of the memory cell MC1 (MC2) is lower than the upper surface position of the dummy gate electrode DG1 (DG2) of the field effect transistor Q1 (Q2). Similarly, the upper surface position of the memory gate electrode MG1 (MG2) of the memory cell MC1 (MC2) is lower than the upper surface position of the dummy gate electrode DG1 (DG2) of the field effect transistor Q1 (Q2). On the other hand, as shown in FIG. 23, the height size of the control gate electrode CG1 (CG2) of the memory cell MC1 (MC2) is equal to the height size of the dummy gate electrode DG1 (DG2) of the field effect transistor Q1 (Q2).

After that, a silicon nitride film SNF1 for covering the memory cell MC1 (MC2) and field effect transistor Q1 (Q2) is formed and a silicon oxide film OXF1 is formed over the silicon nitride film SNF1.

Figure 24:
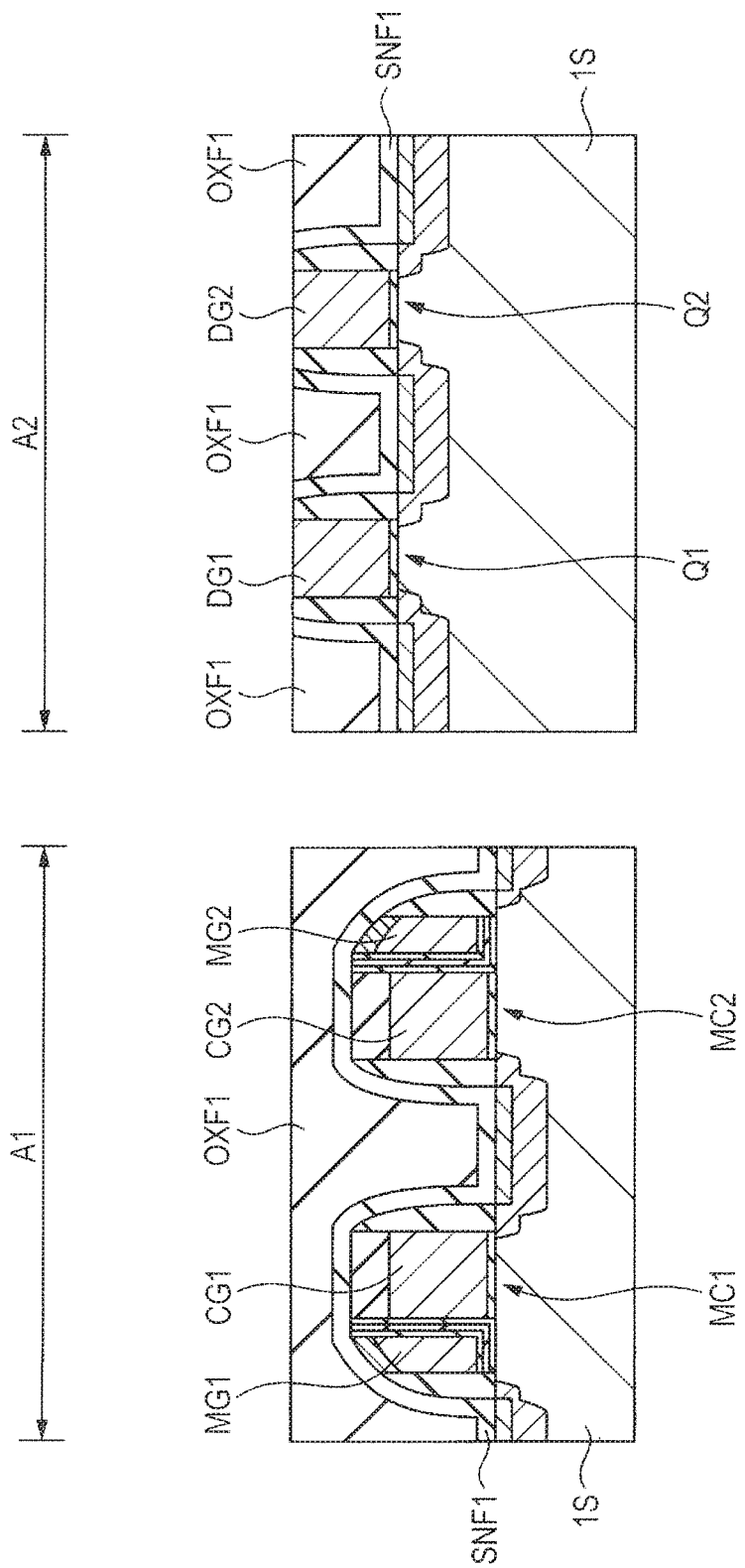
FIG. 24 is a sectional view which shows a step following the step shown in FIG. 23 in the process of manufacturing the semiconductor device.

Next, as shown in FIG. 24, the insulating films (silicon nitride film SNF1 and silicon oxide film OXF1) are polished using the CMP method. Here, polishing is performed with the upper surface of the control gate electrode CG1 (CG2) and the upper surface of the memory gate electrode MG1 (MG2) of the memory cell MC1 (MC2) covered by the insulating films (silicon nitride film SNF1 and silicon oxide film OXF1) so that the upper surface of the dummy gate electrode DG1 (DG2) of the field effect transistor Q1 (Q2) is exposed.

Figure 25:
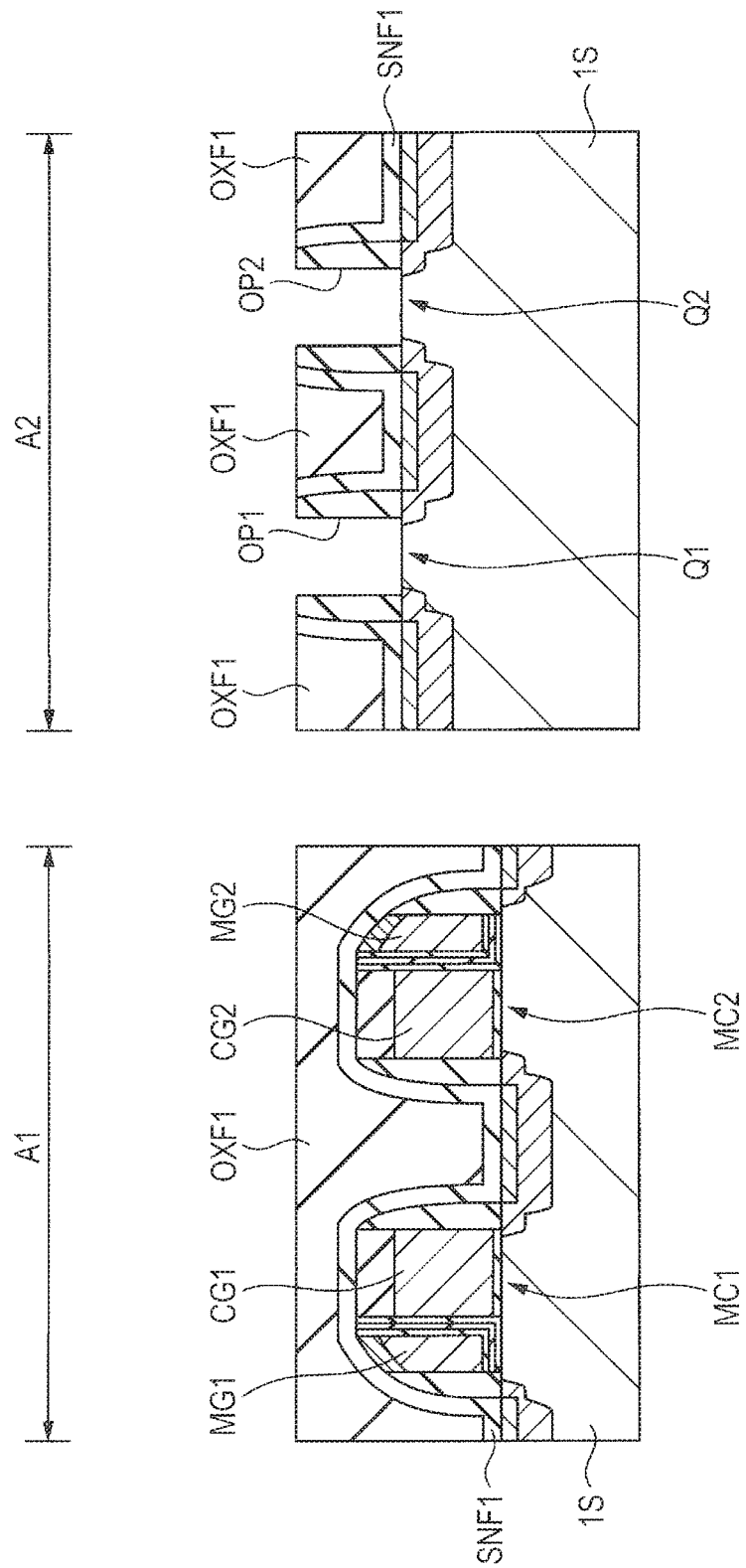
FIG. 25 is a sectional view which shows a step following the step shown in FIG. 24 in the process of manufacturing the semiconductor device.

Next, as shown in FIG. 25, using the etching technique, the dummy gate electrode DG1 (DG2), for example, a polysilicon film, is removed and an opening OP1 (OP2) is made.

Figure 26:
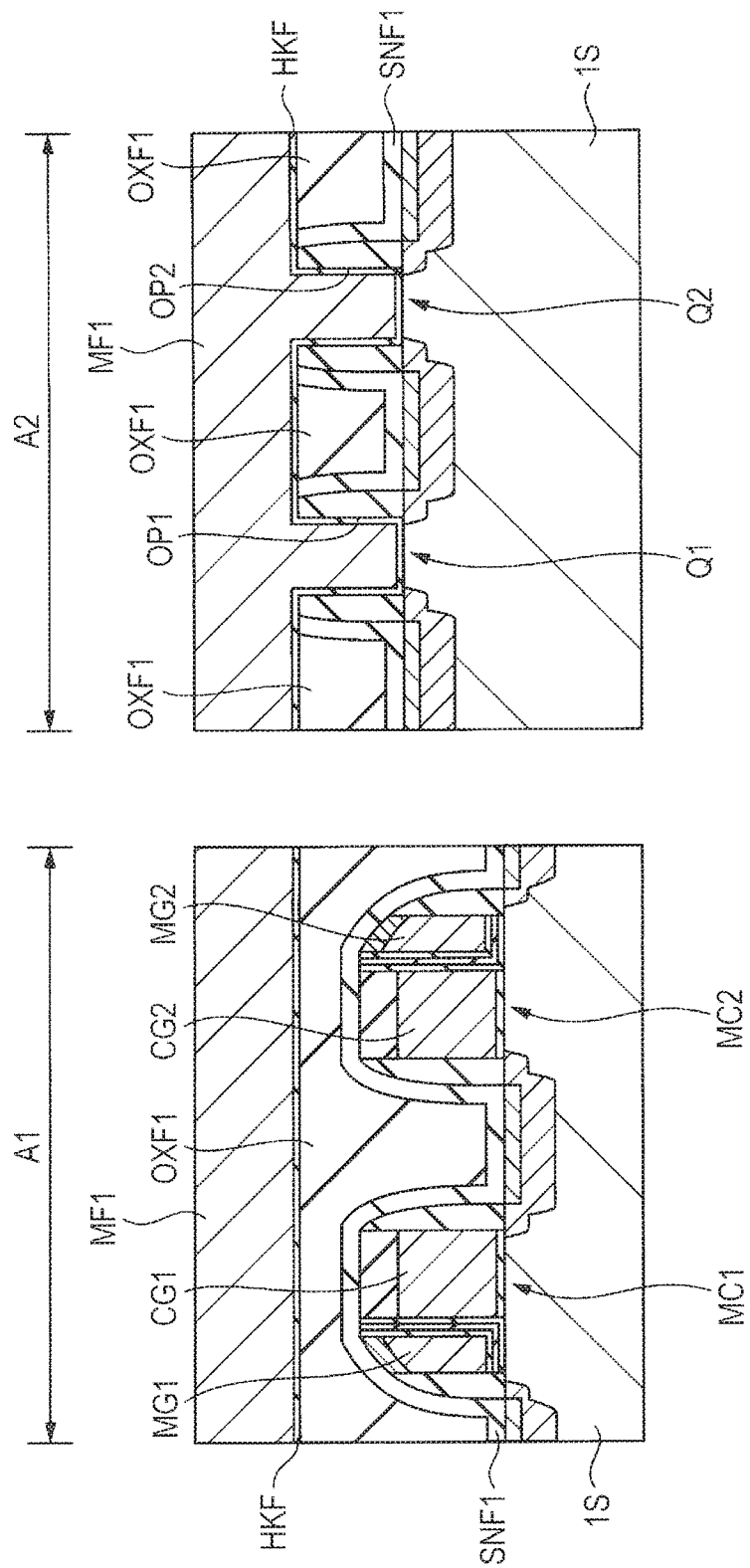
FIG. 26 is a sectional view which shows a step following the step shown in FIG. 25 in the process of manufacturing the semiconductor device.

Next, as shown in FIG. 26, a high-permittivity film HKF with a higher permittivity than a silicon oxide film is formed so as to cover the memory cell formation area A1 and the field effect transistor formation area A2 including the inner wall of the opening OP1 (OP2). Then, a metal-containing conductor film MF1 is formed over the high-permittivity film HKF.

Figure 27:
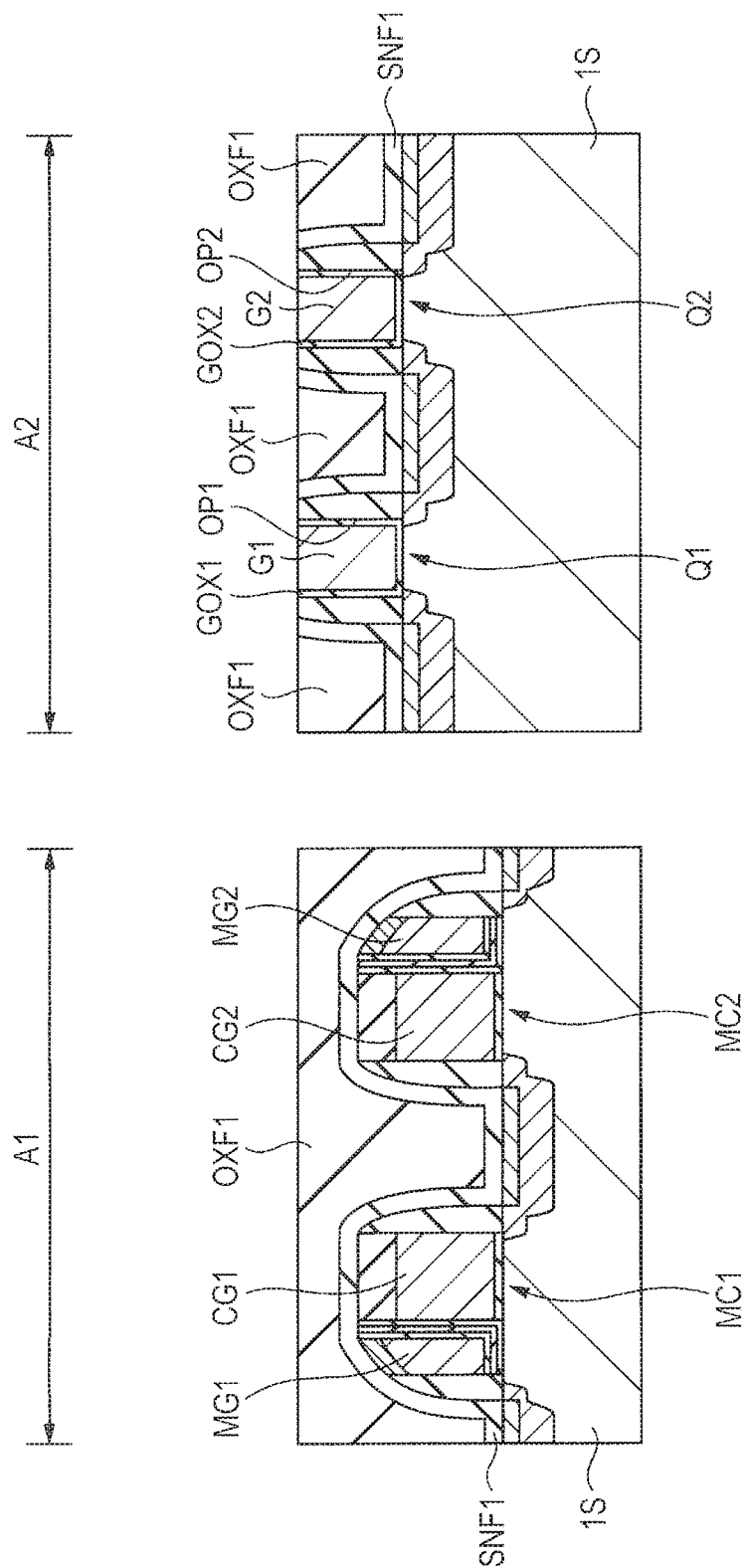
FIG. 27 is a sectional view which shows a step following the step shown in FIG. 26 in the process of manufacturing the semiconductor device.

Next, as shown in FIG. 27, using the CMP method, the high-permittivity film HKF and conductor film MF1 in the memory cell formation area A1 are removed while leaving the high-permittivity film HKF and conductor film MF1 in the opening OP1 (OP2) unremoved. Consequently, a gate insulating film GOX1 (GOX2) and a gate electrode G1 (G2) are formed for a field effect transistor Q1 (Q2).

Figure 28:
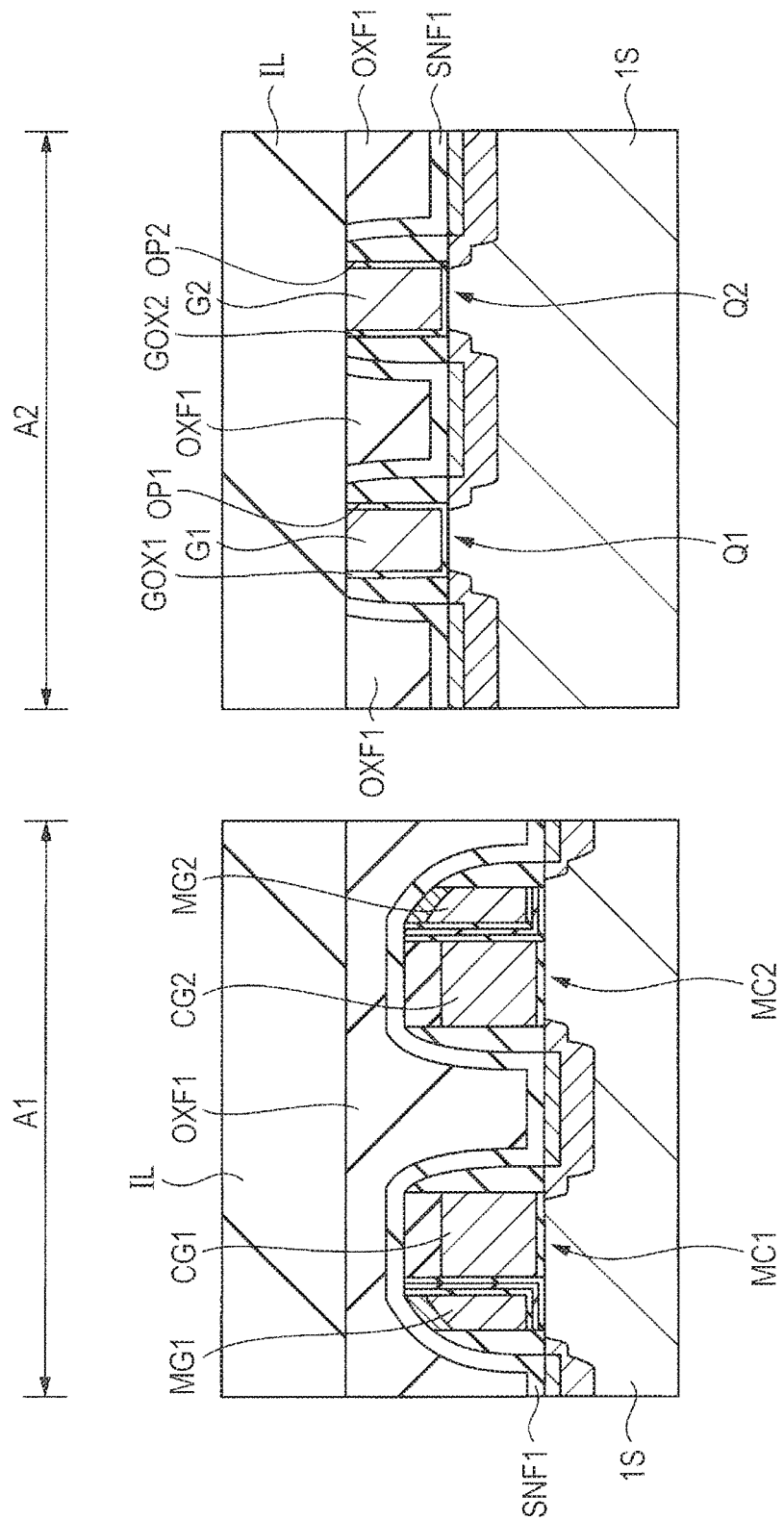
FIG. 28 is a sectional view which shows a step following the step shown in FIG. 27 in the process of manufacturing the semiconductor device.
Figure 29:
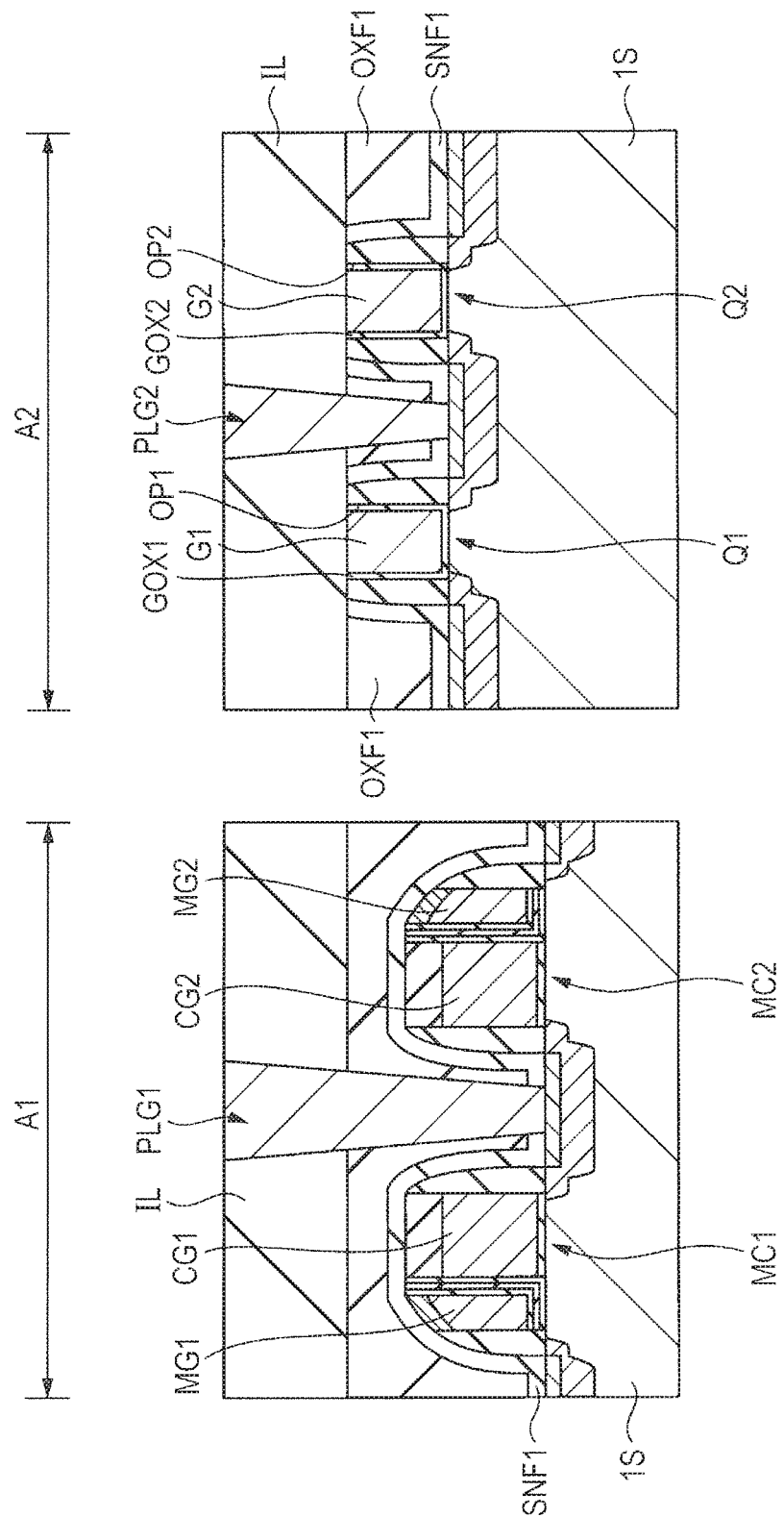
FIG. 29 is a sectional view which shows a step following the step shown in FIG. 28 in the process of manufacturing the semiconductor device.

Next, as shown in FIG. 28, an interlayer insulating film IL, for example, a silicon oxide film, is formed so as to cover the memory cell formation area A1 and the field effect transistor formation area A2. Then, as shown in FIG. 29, contact holes which penetrate the interlayer insulating film IL and reach the front surface of the semiconductor substrate 1S are made using the photolithographic technique and etching technique. Then, a plug PLG1 (PLG2) is formed by burying a conductor film, for example, a tungsten film, in a contact hole. The semiconductor device according to the second embodiment is thus manufactured.

As mentioned above, in the semiconductor device manufacturing method according to the second embodiment, after the semiconductor substrate 1S is formed into a stepped shape in advance, the lower level area is used as the memory cell formation area A1 and the upper level area is used as the field effect transistor formation area A2. Therefore, also in the semiconductor device manufacturing method according to the second embodiment, the height position of the uppermost surface of the memory cell MC1 (MC2) in the memory cell formation area A1 can be made lower than the height position of the uppermost surface of the field effect transistor Q1 (Q2) in the field effect transistor formation area A2. Consequently, in the semiconductor device manufacturing method according to the second embodiment, the upper surface of the field effect transistor Q1 (Q2) can be exposed while the memory cell MC1 (MC2) is covered. Therefore, like the first embodiment, the second embodiment also has a significant technical meaning in the sense that it can solve both the causes of deterioration in the retention characteristics of the memory cell MC1 (MC2), namely direct contact between the memory cell MC1 (MC2) and high-permittivity film HKF and exposure of the upper surface of the memory cell MC1 (MC2).

Advantage of the Second Embodiment

For example, in the second embodiment, the device structure of the memory cell MC1 (MC2) shown in FIG. 29 has not changed from the device structure shown in FIG. 23. This means that in the memory cell MC1 (MC2) according to the second embodiment, the surface of the control gate electrode in the power supply region remains silicidized. Consequently, unlike the semiconductor device manufacturing method according to the first embodiment, the semiconductor device manufacturing method according to the second embodiment does not cause the adverse effect that removal of the silicide film on the upper surface of the control gate electrode CG1 (CG2) results in the increase in the coupling resistance between the control gate electrode CG1 (CG2) and the plug in the power supply region. Therefore, the semiconductor device manufacturing method according to the second embodiment offers an advantage that it is unnecessary to add the step of silicidizing the upper surface of the control gate electrode CG1 (CG2) and the upper surface of the memory gate electrode MG1 (MG2) of the memory cell MC1 (MC2) after taking the step of replacing the dummy gate electrode DG1 (DG2) with the metal gate electrode (gate electrode G1 (G2)).

<Variation>
<<Basic Idea>>

Next, a variation of the second embodiment will be described. The basic idea of this variation is that the semiconductor device manufacturing method according to the second embodiment is applied not to all the memory cells formed in one semiconductor chip, but the semiconductor device manufacturing method according to the second embodiment is applied to some of the memory cells.

In some cases, a plurality of memories with different functions are formed in one semiconductor chip. Specifically, one semiconductor chip may include a memory to be rewritten a relatively large number of times or frequently and a memory to be rewritten a relatively small number of times or less frequently. In this case, the memory to be rewritten frequently is more likely to cause the deterioration in retention characteristics than the memory to be rewritten less frequently. For this reason, in this variation, for a semiconductor device including, for example, a first memory and a second memory which are different in the frequency of rewriting, the semiconductor device manufacturing method according to the second embodiment is applied to the memory cell of the first memory to be rewritten frequently and the ordinary semiconductor device manufacturing method is applied to the memory cell of the second memory to be rewritten less frequently.

According to this variation based on the above basic idea, the retention characteristics of the memory to be rewritten frequently can be improved by the minimum modification of the manufacturing process.

<<Device Structure>>

Next, the structure of the semiconductor device which embodies the basic idea of this variation will be explained.

Figure 30:
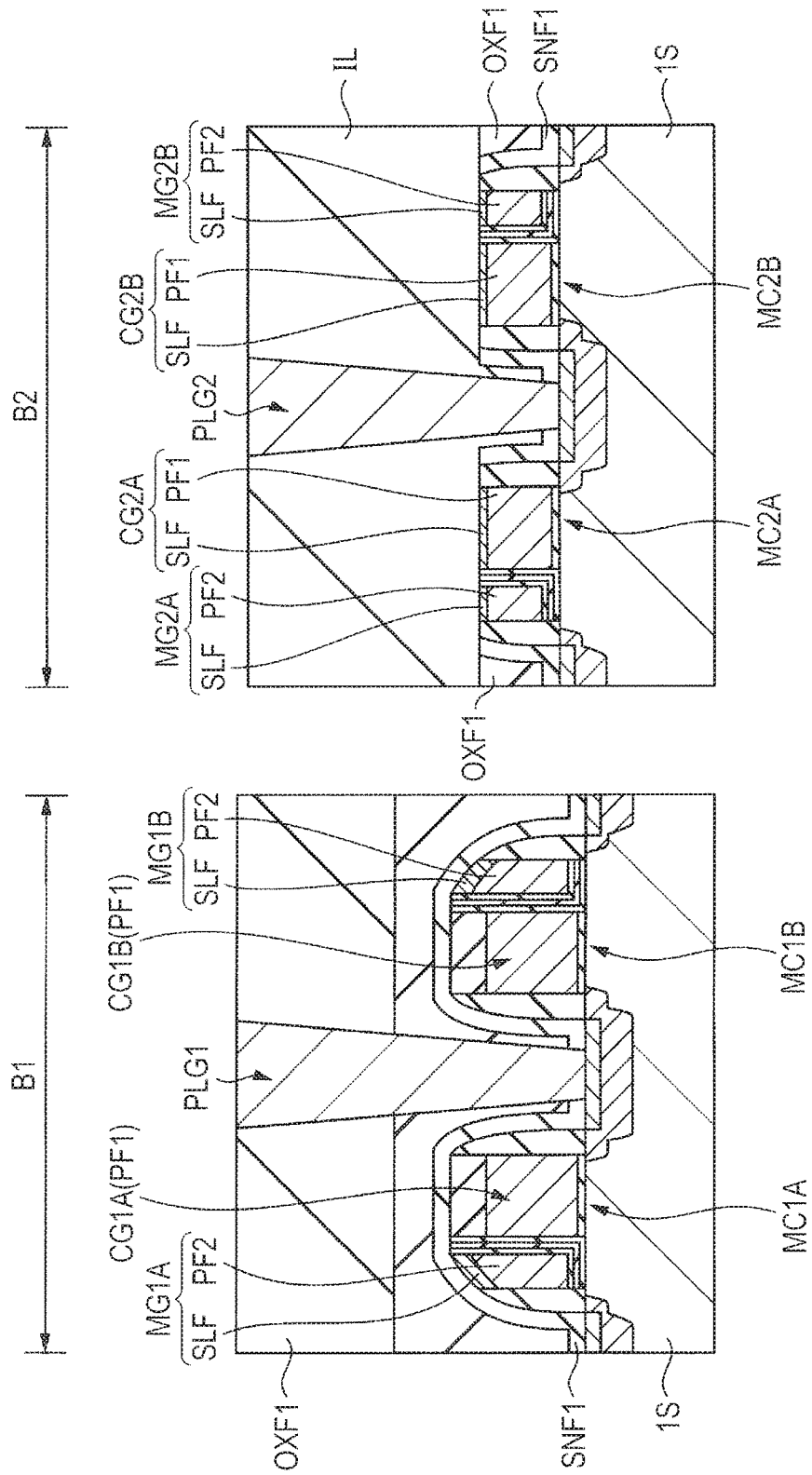
FIG. 30 is a sectional view which shows the process of manufacturing a semiconductor device according to a variation of the second embodiment.

FIG. 30 schematically shows the structure of the semiconductor device according to the variation of the second embodiment. As shown in FIG. 30, one semiconductor chip has a memory cell formation area B1 and a memory cell formation area B2. A memory cell MC1A (MC1B) which configures the first memory to be rewritten frequently is formed in the memory cell formation area B1 and a memory cell MC2A (MC2B) which configures the second memory to be rewritten less frequently is formed in the memory cell formation area B2. The memory cell MC1A (MC1B) and memory cell MC2A (2B) are both rewritable nonvolatile memory cells and have a charge storage film which stores information. The charge storage film is located at least under a memory gate electrode MG1 (MG2). The charge storage film is, for example, an insulating film with a trap level. Specifically, the charge storage film of the memory cell MC1A (MC1B) is a silicon nitride film and the charge storage film of the memory cell MC2A (MC2B) is also a silicon nitride film.

Here, regarding the memory cell formation area B1 and memory cell formation area B2, the semiconductor device manufacturing method according to the second embodiment is applied to the memory cell formation area B1. Consequently, as shown in FIG. 30, the semiconductor device according to the variation has a memory cell MC1A (MC1B) which is formed in the memory cell formation area B1 and includes a control gate electrode CG1A (CG1B) and a memory gate electrode MG1A (MG1B). At the same time, the semiconductor device according to this variation has a memory cell MC2A (MC2B) which is formed in the memory cell formation area B2 and includes a control gate electrode CG2A (CG2B) and a memory gate electrode MG2A (MG2B). Here, the upper surface position of the control gate electrode CG1A (CG1B) is lower than the upper surface position of the control gate electrode CG2A (CG2B) and the upper surface position of the memory gate electrode MG1A (MG1B) is lower than the upper surface position of the memory gate electrode MG2A (MG2B) (difference 1).

In addition, in the semiconductor device shown in FIG. 30, the height size of the control gate electrode CG1A (CG1B) is larger than the height size of the control gate electrode CG2A (CG2B) and the height size of the memory gate electrode MG1A (MG1B) is larger than the height size of the memory gate electrode MG2A (MG2B) (difference 2). In the semiconductor device shown in FIG. 30 in particular, the control gate electrode CG2A (CG2B) and memory gate electrode MG2A (MG2B) of the memory cell MC2A (MC2B) may be each a full silicide electrode. On the other hand, the control gate electrode CG1A (CG1B) of the memory cell MC1A (MC1B) is not silicidized (except in the power supply region). The memory gate electrode MG1A (MG1B) is a partial silicide electrode (difference 3).

When the basic idea of this variation is adopted, the semiconductor device according to this variation which embodies the basic idea includes a plurality of memories which at least have the above differences 1 and 2 and are different from each other in the memory cell device structure.

The invention made by the present inventors has been so far explained concretely in reference to the preferred embodiments thereof. However, the invention is not limited thereto and it is obvious that these details may be modified in various ways without departing from the gist thereof.

For example, the technical ideas of the above embodiments have been so far explained on the assumption that the semiconductor device manufacturing technique is applied to a semiconductor device which includes a memory cell with a planar device structure and a field effect transistor with a planar device structure (for example, a field effect transistor configuring a peripheral circuit). However, the technical ideas of the above embodiments are not limited thereto but they may be applied to manufacturing techniques for a wide range of semiconductor devices including a semiconductor device having, for example, a memory cell with a fin device structure.

The above embodiments include the following modes.
Note 1
A semiconductor device includes:
a first memory cell which is formed in a first memory cell formation area and includes a first control gate electrode and a first memory gate electrode; and
a second memory cell which is formed in a second memory cell formation area and includes a second control gate electrode and a second memory gate electrode, in which
the upper surface position of the first control gate electrode is lower than the upper surface position of the second control gate electrode, and
the upper surface position of the first memory gate electrode is lower than the upper surface position of the second memory gate electrode.
Note 2
The semiconductor device described in Note 1 in which
the height size of the first control gate electrode is smaller than the height size of the second control gate electrode, and
the height size of the first memory gate electrode is smaller than the height size of the second memory gate electrode.

Note 3
The semiconductor device described in Note 1 in which
the height size of the first control gate electrode is larger than the height size of the second control gate electrode, and
the height size of the first memory gate electrode is larger than the height size of the second memory gate electrode.
Note 4
The semiconductor device described in Note 1 in which
the first control gate electrode and the first memory gate electrode of the first memory cell are each made of silicide film, and
the second control gate electrode and the second memory gate electrode of the second memory cell are made of laminated film which includes a polysilicon film and a silicide film.
Note 5
The semiconductor device described in Note 1 in which
the first memory cell and the second memory cell are rewritable memory cells, and
the number of times of rewriting which the first memory cell is requested is larger than the number of times of rewriting which the second memory cell is requested.
Note 6
The semiconductor device described in Note 1 in which
the first memory cell has a charge storage film located under the first memory gate electrode, and
the second memory cell has a charge storage film located under the second memory gate electrode.
Note 7
The semiconductor device described in Note 6 in which
the charge storage film is an insulating film with a trap level.
Note 8
The semiconductor device described in Note 7 in which
the charge storage film is a silicon nitride film.

What is claimed is:
1. A method for manufacturing a semiconductor device having a memory cell formation area and a field effect transistor formation area, comprising the steps of:
(a) forming a memory cell including a control gate electrode and a memory gate electrode in the memory cell formation area and forming a field effect transistor including a dummy gate electrode in the field effect transistor formation area;
(b) after the step (a), forming a first insulating film for covering the memory cell and the field effect transistor;
(c) after the step (b), exposing an upper surface of the control gate electrode and an upper surface of the memory gate electrode of the memory cell and an upper surface of the dummy gate electrode of the field effect transistor by polishing the first insulating film using a chemical mechanical polishing method;
(d) after the step (c), making an upper surface position of the control gate electrode and an upper surface position of the memory gate electrode lower than an upper surface position of the dummy gate electrode;
(e) after the step (d), forming a protective film for covering the control gate electrode and the memory gate electrode of the memory cell;
(f) after the step (e), making an opening by removing the dummy gate electrode;
(g) after the step (f), forming a high-permittivity film with a higher permittivity than a silicon oxide film so as to cover the protective film and an inner wall of the opening;
(h) after the step (g), forming a metal-containing conductor film over the high-permittivity film; and
(i) after the step (h), forming a gate insulating film and a gate electrode for the field effect transistor by removing the high-permittivity film and the conductor film formed over the protective film using the chemical mechanical polishing method while leaving the high-permittivity film and the conductor film inside the opening unremoved.

2. The method for manufacturing a semiconductor device according to claim 1, wherein at the step (d), nonselective etching is used.

3. The method for manufacturing a semiconductor device according to claim 2, wherein at the step (d), dry etching is used.

4. The method for manufacturing a semiconductor device according to claim 1, further comprising the steps of:
- (j) after the step (i), forming a second insulating film so as to cover the protective film formed in the memory cell formation area and the field effect transistor formation area;
- (k) after the step (j), exposing the upper surface of the control gate electrode and the upper surface of the memory gate electrode of the memory cell by removing the second insulating film and the protective film formed in the memory cell formation area while leaving the second insulating film formed in the field effect transistor formation area unremoved;
- (l) after the step (k), forming a metal film so as to cover an upper surface of the memory cell formation area including the upper surface of the control gate electrode and the upper surface of the memory gate electrode of the memory cell and cover the second insulating film formed in the field effect transistor formation area; and
- (m) after the step (l), forming a silicide film over the upper surface of the control gate electrode and the upper surface of the memory gate electrode by making polysilicon films configuring the control gate electrode and the memory gate electrode react with the metal film by heat treatment.

5. The method for manufacturing a semiconductor device according to claim 4, wherein the step (m) is a step to silicidize the control gate electrode and the memory gate electrode entirely.

6. The method for manufacturing a semiconductor device according to claim 1, wherein the memory cell has a charge storage film located under the memory gate electrode.

7. The method for manufacturing a semiconductor device according to claim 6, wherein the charge storage film is an insulating film with a trap level.

8. The method for manufacturing a semiconductor device according to claim 7, wherein the charge storage film is a silicon nitride film.

9. A method for manufacturing a semiconductor device having a memory cell formation area and a field effect transistor formation area, comprising the steps of:
- (a) forming a memory cell including a control gate electrode and a memory gate electrode in the memory cell formation area and forming a field effect transistor including a dummy gate electrode in the field effect transistor formation area;
- (b) after the step (a), forming a first insulating film for covering the memory cell and the field effect transistor;
- (c) after the step (b), exposing an upper surface of the control gate electrode and an upper surface of the memory gate electrode of the memory cell and an upper surface of the dummy gate electrode of the field effect transistor by polishing the first insulating film using a chemical mechanical polishing method;
- (d) forming a third insulating film so as to cover the memory cell formation area and the field effect transistor formation area;
- (e) after the step (d), exposing the upper surface of the control gate electrode and the upper surface of the memory gate electrode of the memory cell by removing the third insulating film formed in the memory cell formation area;
- (f) after the step (e), oxidizing an upper surface of the memory cell formation area including the upper surface of the control gate electrode and the upper surface of the memory gate electrode of the memory cell;
- (g) after the step (f), making an opening by removing the dummy gate electrode;
- (h) after the step (g), forming a high-permittivity film with a higher permittivity than a silicon oxide film so as to cover the protective film and an inner wall of the opening;
- (i) after the step (h), forming a metal-containing conductor film over the high-permittivity film; and
- (j) after the step (i), forming a gate insulating film and a gate electrode for the field effect transistor by removing the high-permittivity film and the conductor film formed over the protective film using the chemical mechanical polishing method while leaving the high-permittivity film and the conductor film inside the opening unremoved.

* * * * *